(12) United States Patent
Li et al.

(10) Patent No.: US 10,763,853 B2
(45) Date of Patent: Sep. 1, 2020

(54) MULTI-MODE POWER MANAGEMENT CIRCUIT

(71) Applicant: TEXAS INSTRUMENTS INCORPORATED, Dallas, TX (US)

(72) Inventors: Wang Li, Allen, TX (US); Qiong M. Li, Allen, TX (US); Yipeng Su, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 170 days.

(21) Appl. No.: 16/137,326

(22) Filed: Sep. 20, 2018

(65) Prior Publication Data

US 2019/0103752 A1    Apr. 4, 2019

Related U.S. Application Data

(60) Provisional application No. 62/566,652, filed on Oct. 2, 2017.

(51) Int. Cl.

| | |
|---|---|
| *H03K 17/687* | (2006.01) |
| *H02J 7/00* | (2006.01) |
| *H03K 17/66* | (2006.01) |
| *H02J 1/10* | (2006.01) |
| *H02J 7/34* | (2006.01) |

(52) U.S. Cl.
CPC ........ *H03K 17/6871* (2013.01); *H02J 7/0068* (2013.01); *H03K 17/667* (2013.01); *H02J 1/10* (2013.01); *H02J 7/34* (2013.01)

(58) Field of Classification Search
CPC .. H02J 7/0068; H02J 1/10; H02J 7/34; H03K 17/667; H03K 17/6871

USPC .................... 307/66, 126; 327/408
See application file for complete search history.

(56) References Cited

U.S. PATENT DOCUMENTS

| | | | |
|---|---|---|---|
| 7,750,505 B2 | 7/2010 | Ichikawa | |
| 2016/0268816 A1 | 9/2016 | Mao | |
| 2020/0044567 A1* | 2/2020 | Barrass | ............... H02M 3/1582 |

FOREIGN PATENT DOCUMENTS

| | | |
|---|---|---|
| CN | 106787727 A | 5/2017 |
| RU | 2254662 C1 | 6/2005 |

OTHER PUBLICATIONS

Search Report for PCT Application No. PCT/US18/53846, Date of mailing of international search report dated Jun. 13, 2019, 1 page.

* cited by examiner

*Primary Examiner* — Michael R. Fin
(74) *Attorney, Agent, or Firm* — Lawrence J. Bassuk; Charles A. Brill; Frank D. Cimino

(57) ABSTRACT

In an example, a circuit comprising a first inductor coupled between a first node and a second node, a first PMOS having a source terminal coupled to the second node and a drain terminal coupled to a third node, a second PMOS having a source terminal coupled to a ground voltage potential and a drain terminal coupled to the second node, a third PMOS having a source terminal coupled to a fourth node and a drain terminal coupled to the third node, a fourth PMOS having a source terminal coupled to the ground voltage potential and a drain terminal coupled to the fourth node, a NMOS having a source terminal coupled to the third node and a drain terminal coupled to a fifth node, a second inductor coupled between the fourth node and the fifth node, and a controller.

20 Claims, 14 Drawing Sheets

|  | TYPICAL CIRCUIT | CIRCUIT 200 | CIRCUIT 300 | CIRCUIT 400 | CIRCUIT 700 |
|---|---|---|---|---|---|
| TOTAL CIRCUIT POWER COMPONENTS | 8 SWITCHES +1 INDUCTOR | 5 SWITCHES +2 INDUCTORS | 6 SWITCHES +2 INDUCTORS | 6 SWITCHES +2 INDUCTORS | 9 SWITCHES +1 INDUCTOR |
| Vbat TO Vout PATH | 2 SWITCHES | 1 SWITCH | 1 SWITCH | 1 SWITCH | 1 SWITCH |
| Vbat TO Vout PATH WHEN Vin>Vbat AND OPERATING IN TURBO BOOST MODE | 5 SWITCHES +1 INDUCTOR | 1 SWITCH +1 INDUCTOR | 1 SWITCH +1 INDUCTOR | 2 SWITCHES +1 INDUCTOR | 5 SWITCHES +1 INDUCTOR |
| Vin TO Vout PATH WHEN Vin<Vbat WHILE CHARGING OR Vbat>Vin WHILE DISCHARGING DURING OTG MODE | 3 SWITCHES +1 INDUCTOR | 1 SWITCH +1 INDUCTOR | 2 SWITCHES +1 INDUCTOR | 2 SWITCHES +1 INDUCTOR | 3 SWITCHES +1 INDUCTOR |
| Vin TO Vbat PATH WHEN Vin<Vbat WHILE CHARGING OR Vbat>Vin WHILE DISCHARGING DURING OTG MODE | 3 SWITCHES +1 INDUCTOR | 2 SWITCHES +1 INDUCTOR | 3 SWITCHES +1 INDUCTOR | 3 SWITCHES +1 INDUCTOR | 3 SWITCHES +1 INDUCTOR |
| Vin TO Vout PATH WHEN Vin>Vbat WHILE CHARGING OR Vbat<Vin WHILE DISCHARGING DURING OTG MODE | 3 SWITCHES +1 INDUCTOR | 1 SWITCH +1 INDUCTOR | 2 SWITCHES +1 INDUCTOR | 2 SWITCHES +1 INDUCTOR | 3 SWITCHES +1 INDUCTOR |
| Vin TO Vbat PATH WHEN Vin>Vbat WHILE CHARGING OR Vbat<Vin WHILE DISCHARGING DURING OTG MODE | 3 SWITCHES +1 INDUCTOR | 2 SWITCHES +2 INDUCTORS | 2 SWITCHES +2 INDUCTORS | 2 SWITCHES +2 INDUCTORS | 3 SWITCHES +1 INDUCTOR |
| Vin TO Vout PATH WHEN Vin≅Vbat | 3 SWITCHES +1 INDUCTOR | 1 SWITCH +1 INDUCTOR | 2 SWITCHES +1 INDUCTOR | 2 SWITCHES +1 INDUCTOR | 3 SWITCHES +1 INDUCTOR |
| Vin TO Vbat PATH WHEN Vin≅Vbat | 3 SWITCHES +1 INDUCTOR | 2 SWITCHES +1 INDUCTOR | 2 SWITCHES +2 INDUCTORS | 2 SWITCHES +2 INDUCTORS | 3 SWITCHES +1 INDUCTOR |

MULTI-MODE POWER MANAGEMENT CIRCUIT

CROSS-REFERENCE TO RELATED APPLICATIONS

The present application claims priority to U.S. Provisional Patent Application No. 62/566,652, which was filed Oct. 2, 2017, is titled "Dynamic Buck-Boost And Power Path Management Apparatus," and is hereby incorporated herein by reference in its entirety.

SUMMARY

Aspects of the present disclosure provide for a circuit. In at least one example, the circuit comprises a first inductor having a first terminal configured to couple to a first node and a second terminal configured to couple to a second node. The circuit further comprises a first p-type metal oxide semiconductor field effect transistor (MOSFET) (PMOS) having a source terminal coupled to the second node and a drain terminal coupled to a third node. The circuit further comprises a second PMOS having a source terminal coupled to a ground voltage potential and a drain terminal coupled to the second node. The circuit further comprises a third PMOS having a source terminal coupled to a fourth node and a drain terminal coupled to the third node. The circuit further comprises a fourth PMOS having a source terminal coupled to the ground voltage potential and a drain terminal coupled to the fourth node. The circuit further comprises a n-type MOSFET (NMOS) having a source terminal coupled to the third node and a drain terminal coupled to a fifth node. The circuit further comprises a second inductor having a first terminal configured to couple to the fourth node and a second terminal configured to couple to the fifth node. The circuit further comprises a controller coupled to a gate terminal of the first PMOS, a gate terminal of the second PMOS, a gate terminal of the third PMOS, a gate terminal of the fourth PMOS, and a gate terminal of the NMOS.

Other aspects of the present disclosure provide for a system comprising a circuit, a load, and a battery. In at least one example, the circuit comprises a first resistor configured to couple between a first node and a second node and a first inductor coupled between the second node and the third node. The circuit further comprises first a PMOS having a source terminal coupled to the third node and a drain terminal coupled to a fourth node. The circuit further comprises a second PMOS having a source terminal coupled to a ground voltage potential and a drain terminal coupled to the third node. The circuit further comprises a third PMOS having a source terminal coupled to a fifth node and a drain terminal coupled to the fourth node. The circuit further comprises a fourth PMOS having a source terminal coupled to the ground voltage potential and a drain terminal coupled to the fifth node. The circuit further comprises a NMOS having a source terminal coupled to the fourth node and a drain terminal coupled to a sixth node. The circuit further comprises a second inductor having a first terminal configured to couple to the fifth node and a second terminal configured to couple to the sixth node. The circuit further comprises a controller coupled to a gate terminal of the first PMOS, a gate terminal of the second PMOS, a gate terminal of the third PMOS, a gate terminal of the fourth PMOS, and a gate terminal of the NMOS. In at least one example, the load is configured to couple to the fourth node. In at least one example, the battery is configured to couple between the sixth node and the ground voltage potential.

Other aspects of the present disclosure provide for a circuit. In at least one example, the circuit comprises a first inductor having a first terminal configured to couple to a first node and a second terminal configured to couple to a second node. The circuit further comprises a first PMOS having a source terminal coupled to the second node and a drain terminal coupled to a third node. The circuit further comprises a second PMOS having a source terminal coupled to a ground voltage potential and a drain terminal coupled to the second node. The circuit further comprises a third PMOS having a source terminal coupled to a fourth node and a drain terminal coupled to the third node. The circuit further comprises a fourth PMOS having a source terminal coupled to the ground voltage potential and a drain terminal coupled to the fourth node. The circuit further comprises a fifth PMOS having a source terminal coupled to a fifth node and a drain terminal coupled to the third node. The circuit further comprises a NMOS having a source terminal coupled to the fourth node and a drain terminal coupled to a sixth node. The circuit further comprises a second inductor having a first terminal configured to couple to the fourth node and a second terminal configured to couple to the sixth node. The circuit further comprises a controller coupled to a gate terminal of the first PMOS, a gate terminal of the second PMOS, a gate terminal of the third PMOS, a gate terminal of the fourth PMOS, a gate terminal of the fifth PMOS, and a gate terminal of the NMOS.

BRIEF DESCRIPTION OF THE DRAWINGS

For a detailed description of various examples, reference will now be made to the accompanying drawings in which:

FIG. 8 shows a table of illustrative circuit characteristics in accordance with various examples.

DETAILED DESCRIPTION

Figure 1:
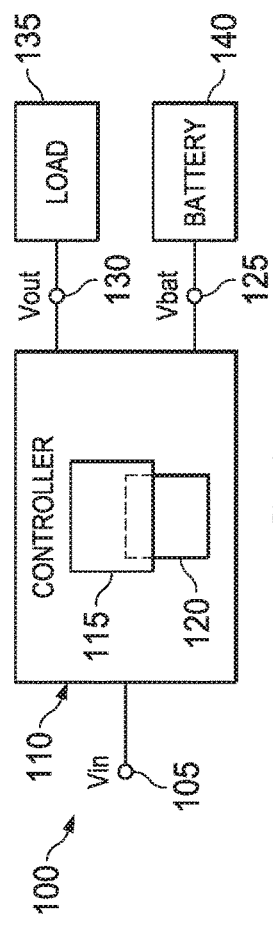
FIG. 1 shows a block diagram of an illustrative system in accordance with various examples.

A design consideration in designing a power management circuit is the efficiency with which the circuit provides power at an output of the circuit. Often, each component in a critical path of the circuit (e.g., a path through which energy flows to the output of the circuit) has an associated loss that reduces the power available at the output of the circuit. In one example of such components that are prevalent in power management circuits and fundamental to their operation, switches (e.g., transistors) have a switching loss and/or a conduction loss that reduces the voltage of signal switched by the switch (e.g., a signal passing from one terminal of the switch to another terminal of the switch). As a result, the more switches in the critical path of a power management circuit, the more power that will be lost due to operation of those switches and efficiency of the power management circuit is reduced.

Certain circuit architectures provide more optimal characteristics for particular use cases than other circuit architectures. For example, a direct power path system may operate efficiently in a power management circuit coupled to a battery and a load when an input voltage (Vin) to the power management circuit is greater than a voltage of the battery (Vbat). For example, such that the direct power path system provides Vin directly to a terminal providing an output voltage (Vout) of the power management circuit. However, when Vin is less than Vbat, the direct power path system is, in many cases, unable to provide Vin directly to the terminal providing Vout. Therefore, the direct power path system may have a limited operational voltage range. Similarly, a buck-boost system may have a wide operational voltage range but may operate inefficiently for a portion of that operational voltage range, such as when Vin is greater than Vbat. Individually, each circuit architecture provides advantages and disadvantages. By combining the two individual circuit architectures, a circuit that performs more efficiently for a greater number of use cases may be possible, however in doing so, challenges arise. Particularly, the two circuit architectures are each fully-functional circuits including a plurality of switches, each with an associated loss, that when combined adds additional switches into the critical path of the power management circuit and detrimentally effects efficiency of operation of the power management circuit.

At least some aspects of the present disclosure provide for a circuit that includes both direct power path functionality and buck-boost functionality while including a minimal number of switches in a critical path of the circuit. In some examples, the circuit is implemented as a power management circuit, such as a dynamic buck-boost and power path management circuit. In at least some examples, the circuit includes a plurality of switches, at least some of which are shared between direct power path functionality and buck-boost functionality. Additionally, in various examples, the circuit includes a plurality of operation modes in which power is provided from a Vin terminal to a Vout terminal, power is provided from a Vbat terminal to the Vout terminal, power is provided from the Vin terminal and the Vbat terminal to the Vout terminal, power is provided from the Vin terminal to the Vout terminal and the Vbat terminal, and/or power is provided from the Vbat terminal to the Vin terminal. In at least some examples, a path between the Vin terminal and the Vout terminal includes no more than three switches, a path between the Vbat terminal and the Vout terminal includes no more than three switches, and/or a path between the Vin terminal and the Vbat terminal includes no more than three switches.

Referring now to FIG. 1, a block diagram of an illustrative system 100 is shown. In some examples, the system 100 is representative of at least a portion of circuitry in a consumer (or professional/enterprise) electronic device. In at least one example, the system 100 is representative of at least a portion of circuitry in a laptop (or notebook, netbook, etc.), a smartphone, a tablet, or a hybrid device having the functionality of any two or more of the above devices. In some example architectures, the system 100 includes a Vin terminal 105, a controller 110, a direct power path circuit 115, a buck-boost circuit 120 (e.g., such as a buck-boost narrow output voltage direct current (DC) (NVDC) circuit), a Vbat terminal 125, and a Vout terminal 130. In at least some examples, the direct power path circuit 115 and the buck-boost circuit 120 share at least some components such that a component count and footprint of the system 100 is minimized. In some examples, the system 100 further includes, or is configured to couple to (e.g., at Vout terminal 130), a load 135. In yet other examples, the system 100 further includes, or is configured to couple to (e.g., at Vbat terminal 125), a battery 140.

The Vin terminal 105 is, in some examples, an input terminal of the system 100. For example, when the system 100 is implemented in an electronic device, the Vin terminal 105 is a charging terminal of the system 100. In at least some examples, the Vin terminal is a Universal Serial Bus (USB) type-C (USB-C) terminal (e.g., a USB-C receptacle). The Vout terminal 130 is, in some examples, configured to couple to the load 135 to provide power to the load 135. For example, when the system 100 is implemented in an electronic device, the load 135 includes a plurality of circuits (not shown) configured to control operation, or implement functionality, or the electronic device.

In an example of operation of the system 100, the controller 110 controls the flow of energy among the Vin terminal 105, the Vbat terminal 125, and/or the Vout terminal 130, for example, to power the load 135, to charge the battery 140, and/or to power or charge an external device (not shown) coupled to the Vin terminal 105. The controller 110 controls the flow of energy, in some examples, by controlling one or more switches (not shown) to conduct, or not conduct, energy between respective terminals of the switches. In one example, the controller 110 controls one or more switches to conduct energy between the Vin terminal 105 and the Vbat terminal 125 while also controlling one or more switches, at least some of which may be the same switches, to conduct energy between the Vin terminal 105 and the Vout terminal 130. In another example, the controller 110 controls one or more switches to conduct energy between the Vin terminal 105 and the Vout terminal 130 while also controlling one or more switches, at least some of which may be the same switches, to conduct energy between the Vbat terminal 125 and the Vout terminal 130. In another example, the controller 110 controls one or more switches to conduct energy between the Vbat terminal 125 and the Vout terminal 130, in some examples via an inductor to boost a value of a signal present at the Vbat terminal 125 prior to delivery to the Vout terminal 130. In another example, the controller 110 controls one or more switches to conduct energy between the Vbat terminal 125 and the Vin terminal 105.

Figure 2:
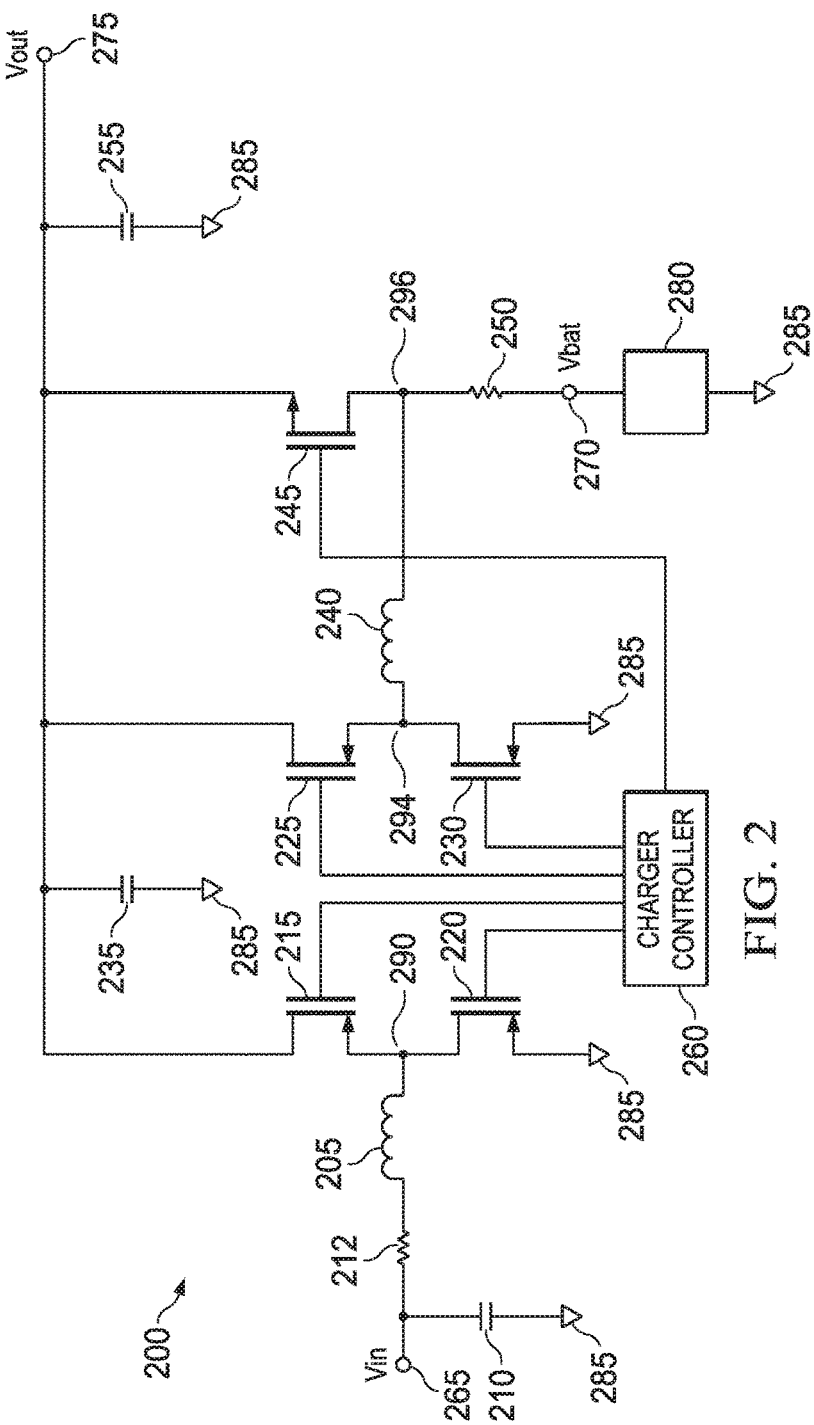
FIG. 2 shows a schematic diagram of an illustrative circuit in accordance with various examples.

Referring now to FIG. 2, a schematic diagram of an illustrative circuit 200 is shown. In some examples, the circuit 200 is a power management circuit, for example, suitable for implementation as the controller 110 of the system 100 of FIG. 1, discussed above. In some examples, the circuit 200 includes, or is configured to couple to, an inductor 205, a capacitor 210, a resistor 212, a p-type metal oxide semiconductor field effect transistor (MOSFET) (PMOS) 215, PMOS 220, PMOS 225, PMOS 230, a capacitor 235, an inductor 240, a n-type MOSFET (NMOS) 245, a resistor 250, a capacitor 255, and/or a charger controller 260, along with a Vin terminal 265 at which a signal Vin is present, Vbat terminal 270 at which a signal Vbat is present, and Vout terminal 275 at which a signal Vout is present. In some examples, the circuit 200 further includes, or is configured to couple to, a battery 280. In at least one example, the charger controller 260 is a processor or microprocessor suitable for monitoring one or more input signals and generating one or more output signals based on determinations made according to values of at least some of the one or more input signals. In other examples, the charger controller 260 is any analog, digital or mixed-signal circuit suitable for performing the signal monitoring and generation as discussed above. Additionally, while certain devices are described herein as PMOS or NMOS, in some examples the devices are replaced by another device of substantially similar functionality (e.g., replacing PMOS with NMOS, NMOS with PMOS, either PMOS or NMOS with bi-polar junction transistor (BJT), etc.), the scope of which is not limited herein. For example, in certain high-power applications, such as high-power switching converters, it may be desirable to replace PMOS devices with NMOS devices.

In an example architecture of the circuit 200, the capacitor 210 is coupled between the Vin terminal 265 and a ground voltage potential 285. The resistor 212 is coupled between the Vin terminal 265 and a first terminal of the inductor 205, and a second terminal of the inductor 205 is coupled to a node 290. A source terminal of the PMOS 215 is coupled to the node 290 and a drain terminal of the PMOS 215 is coupled to the Vout terminal 275. A source terminal of the PMOS 220 is coupled to the ground voltage potential 285 and a drain terminal of the PMOS 220 is coupled to the node 290. The capacitor 235 is coupled between the Vout terminal 275 and the ground voltage potential 285. A source terminal of the PMOS 225 is coupled to a node 294 and a drain terminal of the PMOS 225 is coupled to the Vout terminal 275. A source terminal of the PMOS 230 is coupled to the ground voltage potential 285 and a drain terminal of the PMOS 230 is coupled to the node 294. The inductor 240 is coupled between the node 294 and a node 296. A source terminal of the NMOS 245 is coupled to the Vout terminal 275 and a drain terminal of the NMOS 245 is coupled to the node 296. The resistor 250 is coupled between the node 296 and the Vbat terminal 270. The capacitor 255 is coupled between the Vout terminal 275 and the ground voltage potential 285. In at least some examples, the battery 280 is coupled between the Vbat terminal 270 and the ground voltage potential 285. Further, the charger controller 260 is coupled to gate terminals of each of the PMOS 215, PMOS 220, PMOS 230, and NMOS 245.

In an example of operation of the circuit 200, the charger controller 260 controls the PMOS 215, PMOS 220, PMOS 230, and/or NMOS 245 to operate the circuit 200 in one of a plurality of operation modes. For example, during a charging operation mode, the charger controller 260 controls the PMOS 215, PMOS 220, PMOS 230, and/or NMOS 245 to provide energy from the Vin terminal 265 to both the Vout terminal 275 (e.g., to power devices (not shown) coupled to the Vout terminal 275) and the Vbat terminal 270 (e.g., to charge the battery 280). The charger controller 260 controls the PMOS 215, PMOS 220, PMOS 230, and/or NMOS 245, in some examples, at least partially based on a received control signal (Ctrl) (not shown). Ctrl indicates, in some examples, a value of Vin with respect to a value of Vbat. For examples, Ctrl indicates whether Vin is greater than or less than Vbat. Ctrl is received by the charger controller 260, in some examples, from a device or component outside of, but coupled to, the circuit 200. In other examples, Ctrl is received by the charger controller 260 from a component (not shown) within the circuit 200. In yet other examples, Ctrl is determined by the charger controller 260 based on couplings (not shown) between the charger controller 260 and each of the Vin terminal 265 and the Vbat terminal 270. In some examples, the charger controller 260 further controls the PMOS 215, PMOS 220, PMOS 230, and/or NMOS 245 based on an additional received or generated signal (not shown) specifying an operation mode (e.g., such as one of the operation modes discussed below) for the circuit 200.

During the charging operation mode when Ctrl indicates to the charger controller 260 that Vin is less than Vbat, the charger controller 260 controls the PMOS 215, PMOS 220, and NMOS 245 (e.g., based at least partially on a value of a signal provided to their respective gate terminals) to conduct (or not conduct) energy between their respective source and drain terminals. During the charging operation mode when Vin is less than Vbat, two current paths are formed in the circuit 200. The first current path passes through the resistor 212, inductor 205, and PMOS 215 and provides power from the Vin terminal 265 to the Vout terminal 275. The second current path alternatingly passes through the resistor 212, inductor 205, PMOS 215, NMOS 245, and resistor 250 and provides power from the Vin terminal 265 to the Vbat terminal 270 or from the Vin terminal 265 through the resistor 212, inductor 205, and PMOS 220 to the ground voltage potential 285.

In at least some examples, the charger controller 260 controls the PMOS 215 and the PMOS 220 to selectively activate and deactivate (e.g., conduct energy between their respective source and drain terminals and not conduct energy between their respective source and drain terminals) at a duty cycle selected such that the inductor 205, PMOS 215, PMOS 220, capacitor 235, and capacitor 255 form a boost converter. For example, when the PMOS 215 is inactive and not conducting energy between its source and drain terminals and the PMOS 220 is active and conducting energy between its source and drain terminals, the inductor 205 is charging (e.g., storing energy) and energy previously stored in the capacitor 235 and the capacitor 255 is discharged to the Vbat terminal 270 and the Vout terminal 275. When the PMOS 215 is active and the PMOS 220 is inactive, the inductor 205 discharges to the Vbat terminal 270 and the Vout terminal 275, also at least partially recharging the capacitor 235 and the capacitor 255. Based on the duty cycle selected for control of the PMOS 215 and the PMOS 220 by the charger controller 260, as well as an inductance value of the inductor 205, a value of Vin is increased (e.g., boosted) prior to being provided to the Vbat terminal 270 and the Vout terminal 275.

During the charging operation mode when Ctrl indicates to the charger controller 260 that Vin is greater than Vbat, the charger controller 260 controls the PMOS 215, PMOS 225, and PMOS 230 to conduct (or not conduct) energy between their respective source and drain terminals. During the charging operation mode when Vin is greater than Vbat, two current paths are formed in the circuit 200. The first current path passes through the resistor 212, inductor 205, and PMOS 215 and provides power from the Vin terminal 265 to the Vout terminal 275. The second current path alternatingly passes through the resistor 212, inductor 205, PMOS 215, PMOS 225, inductor 240, and resistor 250 and provides power from the Vin terminal 265 to the Vbat terminal 270 or through the PMOS 230, inductor 240, and resistor 250 to the Vbat terminal 270.

In at least some examples, the charger controller 260 controls the PMOS 225 and the PMOS 230 to selectively activate and deactivate (e.g., conduct energy between its source and drain terminals and not conduct energy between its source and drain terminals) at a duty cycle selected such that the inductor 240, PMOS 225, and PMOS 230 form a buck converter. For example, when the PMOS 225 is active and the PMOS 230 is inactive, the inductor 240 is charging and power is not provided to the Vbat terminal 270. When the PMOS 225 is inactive and the PMOS 230 is active, the inductor 205 discharges to the Vbat terminal 270. Based on the duty cycle selected for control of the PMOS 225 and the PMOS 230 by the charger controller 260, as well as an inductance value of the inductor 240, a value of Vin is reduced (e.g., bucked) prior to being provided to the Vbat terminal 270.

During a discharge operation mode (e.g., when Vin is not received by the circuit 200 at the Vin terminal 265), the charger controller 260 controls the NMOS 245 to conduct energy between its source and drain terminals. During the discharge operation mode one current path is formed in the circuit 200. The current path passes from the Vbat terminal 270 through the resistor 250 and NMOS 245 to the Vout terminal 275.

During an on-the-go (OTG) operation mode when Ctrl indicates to the charger controller 260 that Vin is less than Vbat, the charger controller 260 controls the PMOS 215, PMOS 220, and NMOS 245 (e.g., based at least partially on a value of a signal provided to their respective gate terminals) to conduct (or not conduct) energy between their respective source and drain terminals. During the OTG operation mode when Vin is less than Vbat, a current path is formed from the Vbat terminal 270 to the Vin terminal 265. The current path alternatingly passes from the Vbat terminal 270 through the resistor 250, NMOS 245, PMOS 215, inductor 205, and resistor 212 or through the PMOS 220, inductor 205, and resistor 212 to the Vin terminal 265.

In at least some examples, the charger controller 260 controls the PMOS 215 and the PMOS 220 to selectively activate and deactivate at a duty cycle selected such that the inductor 205, PMOS 215, and PMOS 220 form a buck converter. For example, when the PMOS 215 is active and conducting energy between its source and drain terminals, the inductor 205 is charging. When the PMOS 215 is active and the PMOS 220 is inactive, the inductor 205 is charging and power is not provided to the Vin terminal 265 from the Vbat terminal 270. When the PMOS 215 is inactive and the PMOS 220 is active, the inductor 205 discharges to the Vin terminal 265. Based on the duty cycle selected for control of the PMOS 215 and the PMOS 220 by the charger controller 260, as well as an inductance value of the inductor 205, a value of Vbat is reduced prior to being provided to the Vin terminal 265.

During the OTG operation mode when Ctrl indicates to the charger controller 260 that Vin is greater than Vbat, the charger controller 260 controls the PMOS 215, PMOS 220, and PMOS 225 to conduct (or not conduct) energy between their respective source and drain terminals. During the OTG operation mode when Vin is greater than Vbat, a current path is formed from the Vbat terminal 270 to the Vin terminal 265. The current path passes from the Vbat terminal 270 through the resistor 250, inductor 240, PMOS 225, PMOS 215, inductor 205, and resistor 212.

In at least some examples, the charger controller 260 controls the PMOS 215 and the PMOS 220 to selectively activate and deactivate at a duty cycle selected such that the inductor 205, PMOS 215, PMOS 220, and capacitor 210 form a boost converter. For example, when the PMOS 215 is active and the PMOS 220 is inactive, the inductor 205 is charging and energy previously stored in the capacitor 210 is discharged to the Vin terminal 265. When the PMOS 215 is inactive and the PMOS 220 is active, the inductor 205 discharges to the Vin terminal 265, also at least partially recharging the capacitor 210. Based on the duty cycle selected for control of the PMOS 215 and the PMOS 220 by the charger controller 260, as well as an inductance value of the inductor 205, a value of Vbat is increased prior to being provided to the Vin terminal 265.

During a turbo operation mode (sometimes referred to as a hybrid operation mode or a turbo boost mode), a demand by a load (not shown) coupled to the Vout terminal 275 is greater than can be satisfied by Vin and the charger controller 260 controls the PMOS 215, PMOS 225, and PMOS 230 to conduct (or not conduct) energy between their respective source and drain terminals. During the turbo operation mode, two current paths are formed in the circuit 200. The first current path passes from the Vin terminal 265 through the resistor 212, inductor 205, and PMOS 215 to the Vout terminal 275. The second current path alternatingly passes from the Vbat terminal 270 through the resistor 250, inductor 240, and PMOS 225 to the Vout terminal 275 or from the Vbat terminal 270 through the resistor 250, inductor 240, and PMOS 230 to the ground voltage potential 285.

In at least some examples, the charger controller 260 controls the PMOS 225 and the PMOS 230 to selectively activate and deactivate at a duty cycle selected such that the inductor 240, PMOS 225, PMOS 230, capacitor 235, and capacitor 255 form a boost converter. For example, when the PMOS 225 is inactive and the PMOS 230 is active, the inductor 240 is charging and, in some examples, energy previously stored in the capacitor 235 and the capacitor 255 is discharged to the Vout terminal 275. When the PMOS 225 is active and the PMOS 230 is inactive, the inductor 240 discharges to the Vout terminal 275, in some examples also at least partially recharging the capacitor 235 and the capacitor 255. Based on the duty cycle selected for control of the PMOS 225 and the PMOS 230 by the charger controller 260, as well as an inductance value of the inductor 240, a value of Vbat is increased prior to being provided to the Vout terminal 275.

During an uninterrupted power supply (UPS) operation mode, Vbat supplements power provided to the Vout terminal 275 by Vin, as well as provides power to the Vin terminal 265. During the UPS operation mode, when Vin is less than a preset value, when Ctrl indicates to the charger controller 260 that Vin is less than Vbat, or when the charger controller 260 detects that Vin is no longer being received at Vin terminal 265, the charger controller 260 controls the PMOS 215, PMOS 220, and NMOS 245 to conduct (or not conduct) energy between their respective source and drain terminals. During the UPS operation mode when Vin is less than Vbat, two current paths are formed in the circuit 200 substantially the same as during the OTG operation mode when Vin is less than Vbat and during the discharge operation mode, the details of which are not repeated herein.

Figure 3:
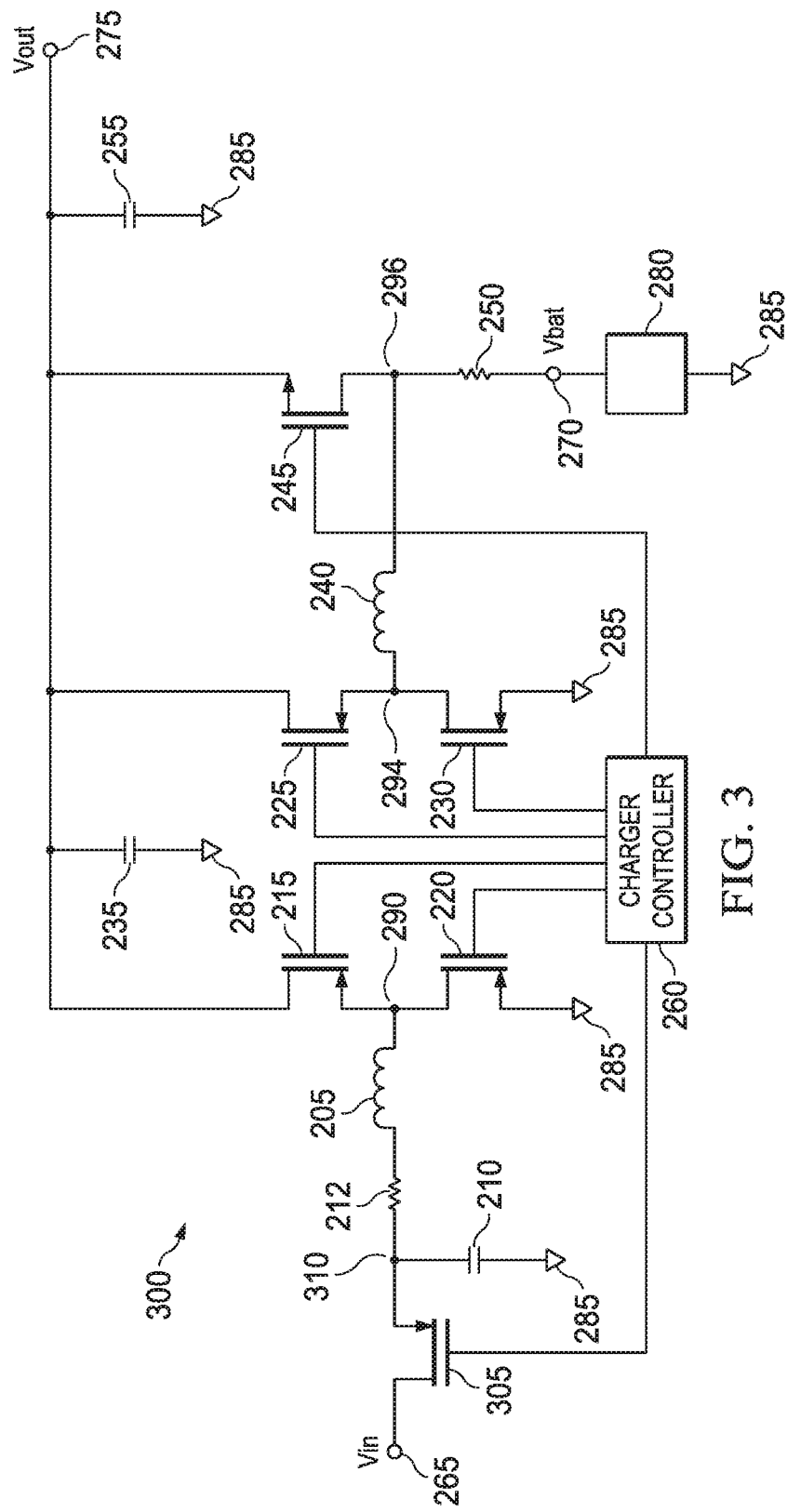
FIG. 3 shows a schematic diagram of an illustrative circuit in accordance with various examples.

Referring now to FIG. 3, a schematic diagram of an illustrative circuit 300 is shown. In some examples, the circuit 300 is a power management circuit, for example, suitable for implementation as the controller 110 of the system 100 of FIG. 1, discussed above. Further, in some examples, at least some elements of the circuit 300 are substantially similar in form and/or function to elements of the circuit 200 of FIG. 2, and reference is made in FIG. 3 to the elements of circuit 200. In some examples, the circuit 300 includes the elements of circuit 200 and a PMOS 305. In at least some examples, the addition of the PMOS 305 to the architecture of circuit 200 to form circuit 300 provides for enhanced functionality including at least controlling an amount of inrush current conveyed by the circuit 300 from the Vin terminal 265 to the Vout terminal 275 and/or providing a mechanism for disconnecting the Vout terminal 275 from the Vin terminal 265, for example, to protect the Vin terminal 265 from over current, over voltage, or an electrical short in a load (not shown) coupled to the Vout terminal 275.

In an example architecture of the circuit 300, a source terminal of the PMOS 305 is coupled to a node 310 and a drain terminal of the PMOS 305 is coupled to the Vin terminal 265. The capacitor 210 is coupled between the node 310 and a ground voltage potential 285. The resistor 212 is coupled between the node 310 and a first terminal of the inductor 205, and a second terminal of the inductor 205 is coupled to a node 290. A source terminal of the PMOS 215 is coupled to the node 290 and a drain terminal of the PMOS 215 is coupled to the Vout terminal 275. A source terminal of the PMOS 220 is coupled to the ground voltage potential 285 and a drain terminal of the PMOS 220 is coupled to the node 290. The capacitor 235 is coupled between the Vout terminal 275 and the ground voltage potential 285. A source terminal of the PMOS 225 is coupled to the node 294 and a drain terminal of the PMOS 225 is coupled to the Vout terminal 275. A source terminal of the PMOS 230 is coupled to the ground voltage potential 285 and a drain terminal of the PMOS 230 is coupled to the node 294. The inductor 240 is coupled between the node 294 and a node 296. A source terminal of the NMOS 245 is coupled to the Vout terminal 275 and a drain terminal of the NMOS 245 is coupled to the node 296. The resistor 250 is coupled between the node 296 and the Vbat terminal 270. The capacitor 255 is coupled between the Vout terminal 275 and the ground voltage potential 285. In at least some examples, the battery 280 is coupled between the Vbat terminal 270 and the ground voltage potential 285. Further, the charger controller 260 is coupled to gate terminals of each of the PMOS 215, PMOS 220, PMOS 230, NMOS 245, and PMOS 305.

In an example of operation of the circuit 300, the charger controller 260 controls the PMOS 215, PMOS 220, PMOS 230, NMOS 245, and/or PMOS 305 to operate the circuit 200 in one of a plurality of operation modes. For example, during a charging operation mode, the charger controller 260 controls the PMOS 215, PMOS 220, PMOS 230, NMOS 245, and/or PMOS 305 to provide energy from the Vin terminal 265 to both the Vout terminal 275 (e.g., to power devices (not shown) coupled to the Vout terminal 275) and the Vbat terminal 270 (e.g., to charge the battery 280). The charger controller 260 controls the PMOS 215, PMOS 220, PMOS 230, NMOS 245, and/or PMOS 305, in some examples, at least partially based on Ctrl (not shown). Ctrl indicates, in some examples, a value of Vin with respect to a value of Vbat. For examples, Ctrl indicates whether Vin is greater than or less than Vbat. Ctrl is received by the charger controller 260, in some examples, from a device or component outside of, but coupled to, the circuit 200. In other examples, Ctrl is received by the charger controller 260 from a component (not shown) within the circuit 200. In yet other examples, Ctrl is determined by the charger controller 260 based on couplings (not shown) between the charger controller 260 and each of the Vin terminal 265 and the Vbat terminal 270. In some examples, the charger controller 260 further controls the PMOS 215, PMOS 220, PMOS 230, NMOS 245, and/or PMOS 305 based on an additional received or generated signal (not shown) specifying an operation mode (e.g., such as one of the operation modes discussed below) for the circuit 300.

During the charging operation mode when Ctrl indicates to the charger controller 260 that Vin is less than Vbat, the charger controller 260 controls the PMOS 215, PMOS 220, NMOS 245, and PMOS 305 to conduct (or not conduct) energy between their respective source and drain terminals. During the charging operation mode when Vin is less than Vbat, two current paths are formed in the circuit 300. The first current path passes through the PMOS 305, resistor 212, inductor 205, and PMOS 215 and provides power from the Vin terminal 265 to the Vout terminal 275. The second current path alternatingly passes through the PMOS 305, resistor 212, inductor 205, PMOS 215, NMOS 245, and resistor 250 and provides power from the Vin terminal 265 to the Vbat terminal 270 or from the Vin terminal 265 through the PMOS 305, resistor 212, inductor 205, and PMOS 220 to the ground voltage potential 285.

In at least some examples, the charger controller 260 controls the PMOS 215 and the PMOS 220 to selectively activate and deactivate (e.g., conduct energy between their respective source and drain terminals and not conduct energy between their respective source and drain terminals) at a duty cycle selected such that the inductor 205, PMOS 215, PMOS 220, capacitor 235, and capacitor 255 form a boost converter. For example, when the PMOS 215 is inactive and not conducting energy between its source and drain terminals and the PMOS 220 is active and conducting energy between its source and drain terminals, the inductor 205 is charging (e.g., storing energy) and energy previously stored in the capacitor 235 and the capacitor 255 is discharged to the Vbat terminal 270 and the Vout terminal 275. When the PMOS 215 is active and the PMOS 220 is inactive, the inductor 205 discharges to the Vbat terminal 270 and the Vout terminal 275, also at least partially recharging the capacitor 235 and the capacitor 255. Based on the duty cycle selected for control of the PMOS 215 and the PMOS 220 by the charger controller 260, as well as an inductance value of the inductor 205, a value of Vin is increased (e.g., boosted) prior to being provided to the Vbat terminal 270 and the Vout terminal 275.

During the charging operation mode when Ctrl indicates to the charger controller 260 that Vin is greater than Vbat, the charger controller 260 controls the PMOS 215, PMOS 225, PMOS 230, and PMOS 305 to conduct (or not conduct) energy between their respective source and drain terminals. During the charging operation mode when Vin is greater than Vbat, two current paths are formed in the circuit 300. The first current path passes through the PMOS 305, resistor 212, inductor 205, and PMOS 215 and provides power from the Vin terminal 265 to the Vout terminal 275. The second current path alternatingly passes through the PMOS 305, resistor 212, inductor 205, PMOS 215, PMOS 225, inductor 240, and resistor 250 and provides power from the Vin terminal 265 to the Vbat terminal 270 or through the PMOS 230, inductor 240, and resistor 250 to the Vbat terminal 270.

In at least some examples, the charger controller 260 controls the PMOS 225 and the PMOS 230 to selectively activate and deactivate (e.g., conduct energy between its source and drain terminals and not conduct energy between its source and drain terminals) at a duty cycle selected such that the inductor 240, PMOS 225, and PMOS 230 form a buck converter. For example, when the PMOS 225 is active and the PMOS 230 is inactive, the inductor 240 is charging and power is not provided to the Vbat terminal 270. When the PMOS 225 is inactive and the PMOS 230 is active, the inductor 205 discharges to the Vbat terminal 270. Based on the duty cycle selected for control of the PMOS 225 and the PMOS 230 by the charger controller 260, as well as an inductance value of the inductor 240, a value of Vin is reduced (e.g., bucked) prior to being provided to the Vbat terminal 270.

During a discharge operation mode (e.g., when Vin is not received by the circuit 200 at the Vin terminal 265), the charger controller 260 controls the NMOS 245 to conduct energy between its source and drain terminals. During the discharge operation mode one current path is formed in the circuit 300. The current path passes from the Vbat terminal 270 through the resistor 250 and NMOS 245 to the Vout terminal 275.

During an OTG operation mode when Ctrl indicates to the charger controller 260 that Vin is less than Vbat, the charger controller 260 controls the PMOS 215, PMOS 220, NMOS 245, and PMOS 305 to conduct (or not conduct) energy between their respective source and drain terminals. During the OTG operation mode when Vin is less than Vbat, a current path is formed from the Vbat terminal 270 to the Vin terminal 265. The current path alternatingly passes from the Vbat terminal 270 through the resistor 250, NMOS 245, PMOS 215, inductor 205, and resistor 212 or through the PMOS 220, inductor 205, resistor 212, and PMOS 305 to the Vin terminal 265.

In at least some examples, the charger controller 260 controls the PMOS 215 and the PMOS 220 to selectively activate and deactivate at a duty cycle selected such that the inductor 205, PMOS 215, PMOS 220 form a buck converter. For example, when the PMOS 215 is active and conducting energy between its source and drain terminals, the inductor 205 is charging. When the PMOS 215 is active and the PMOS 220 is inactive, the inductor 205 is charging and power is not provided to the Vin terminal 265 from the Vbat terminal 270. When the PMOS 215 is inactive and the PMOS 220 is active, the inductor 205 discharges to the Vin terminal 265. Based on the duty cycle selected for control of the PMOS 215 and the PMOS 220 by the charger controller 260, as well as an inductance value of the inductor 205, a value of Vbat is reduced prior to being provided to the Vin terminal 265.

During the OTG operation mode when Ctrl indicates to the charger controller 260 that Vin is greater than Vbat, the charger controller 260 controls the PMOS 215, PMOS 220, PMOS 225, and PMOS 305 to conduct (or not conduct) energy between their respective source and drain terminals. During the OTG operation mode when Vin is greater than Vbat, a current path is formed from the Vbat terminal 270 to the Vin terminal 265. The current path passes from the Vbat terminal 270 through the resistor 250, inductor 240, PMOS 225, PMOS 215, inductor 205, resistor 212, and PMOS 305.

In at least some examples, the charger controller 260 controls the PMOS 215 and the PMOS 220 to selectively activate and deactivate at a duty cycle selected such that the inductor 205, PMOS 215, PMOS 220, and capacitor 210 form a boost converter. For example, when the PMOS 215 is active and the PMOS 220 is inactive, the inductor 205 is charging and energy previously stored in the capacitor 210 is discharged to the Vin terminal 265. When the PMOS 215 is inactive and the PMOS 220 is active, the inductor 205 discharges to the Vin terminal 265, also at least partially recharging the capacitor 210. Based on the duty cycle selected for control of the PMOS 215 and the PMOS 220 by the charger controller 260, as well as an inductance value of the inductor 205, a value of Vbat is increased prior to being provided to the Vin terminal 265.

During a turbo operation mode, a demand by a load (not shown) coupled to the Vout terminal 275 is greater than can be satisfied by Vin and the charger controller 260 controls the PMOS 215, PMOS 225, PMOS 230, and PMOS 305 to conduct (or not conduct) energy between their respective source and drain terminals. During the turbo operation mode, two current paths are formed in the circuit 300. The first current path passes from the Vin terminal 265 through the PMOS 305, resistor 212, inductor 205, and PMOS 215 to the Vout terminal 275. The second current path alternatingly passes from the Vbat terminal 270 through the resistor 250, inductor 240, and PMOS 225 to the Vout terminal 275 or from the Vbat terminal 270 through the resistor 250, inductor 240, and PMOS 230 to the ground voltage potential 285.

In at least some examples, the charger controller 260 controls the PMOS 225 and the PMOS 230 to selectively activate and deactivate at a duty cycle selected such that the inductor 240, PMOS 225, PMOS 230, capacitor 235, and capacitor 255 form a boost converter. For example, when the PMOS 225 is inactive and the PMOS 230 is active, the inductor 240 is charging and, in some examples, energy previously stored in the capacitor 235 and the capacitor 255 is discharged to the Vout terminal 275. When the PMOS 225 is active and the PMOS 230 is inactive, the inductor 240 discharges to the Vout terminal 275, in some examples also at least partially recharging the capacitor 235 and the capacitor 255. Based on the duty cycle selected for control of the PMOS 225 and the PMOS 230 by the charger controller 260, as well as an inductance value of the inductor 240, a value of Vbat is increased prior to being provided to the Vout terminal 275.

During an UPS operation mode, Vbat supplements power provided to the Vout terminal 275 by Vin, as well as provides power to the Vin terminal 265. During the UPS operation mode, when Ctrl indicates to the charger controller 260 that Vin is less than Vbat, the charger controller 260 controls the PMOS 215, PMOS 220, NMOS 245, and PMOS 305 to conduct (or not conduct) energy between their respective source and drain terminals. During the UPS operation mode when Vin is less than Vbat, two current paths are formed in the circuit 300 substantially the same as during the OTG operation mode when Vin is less than Vbat and during the discharge operation mode, the details of which are not repeated herein.

During the UPS operation mode, when Ctrl indicates to the charger controller 260 that Vin is greater than Vbat, the charger controller 260 controls the PMOS 215, PMOS 220, PMOS 225, and PMOS 305 to conduct (or not conduct) energy between their respective source and drain terminals. During the UPS operation mode when Vin is greater than Vbat, two current paths are formed in the circuit 300 substantially the same as during the OTG operation mode when Vin is greater than Vbat and during the turbo operation mode when Vin is greater than Vbat, the details of which are not repeated herein.

Figure 4:
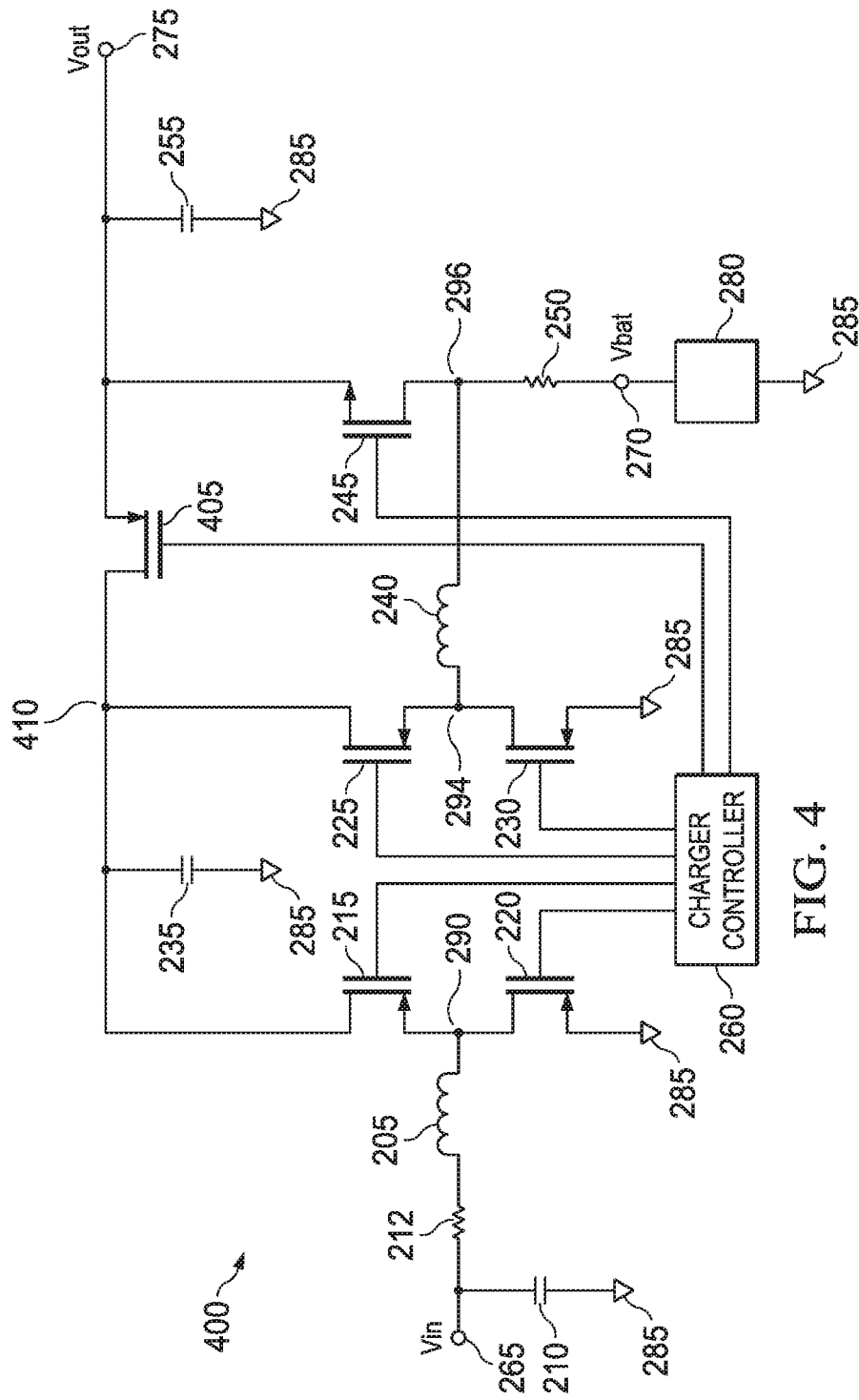
FIG. 4 shows a schematic diagram of an illustrative circuit in accordance with various examples.

Referring now to FIG. 4, a schematic diagram of an illustrative circuit 400 is shown. In some examples, the circuit 400 is a power management circuit, for example, suitable for implementation as the controller 110 of the system 100 of FIG. 1, discussed above. Further, in some examples, at least some elements of the circuit 400 are substantially similar in form and/or function to elements of the circuit 200 of FIG. 2, and reference is made in FIG. 4 to the elements of circuit 200. In some examples, the circuit 400 includes the elements of circuit 200 and a PMOS 405. In at least some examples, the addition of the PMOS 405 to the architecture of circuit 200 to form circuit 400 provides for enhanced functionality including at least controlling an amount of inrush current conveyed by the circuit 400 from the Vin terminal 265 to the Vout terminal 275 and/or providing a mechanism for disconnecting the Vout terminal 275 from the Vin terminal 265, for example, to protect the Vin terminal 265 from over current, over voltage, or an electrical short in a load (not shown) coupled to the Vout terminal 275. Additionally, in some examples the PMOS 405 provides for selectable isolation of the Vout terminal 275 from node 410 such that a signal present at node 410 may have a value (e.g., a voltage) higher than Vout, for example, when the Vbat terminal 270 is coupled to the Vin terminal 265 and the Vout terminal 275 and Vbat is boosted prior to delivery to the Vin terminal 265 but not prior to delivery to the Vout terminal 275. Although not shown, in some examples the circuit 400 further includes the PMOS 305 as shown and described with respect to the circuit 300 of FIG. 3.

In an example architecture of the circuit 400, the capacitor 210 is coupled between the Vin terminal 265 and a ground voltage potential 285. The resistor 212 is coupled between the Vin terminal 265 and a first terminal of the inductor 205, and a second terminal of the inductor 205 is coupled to a node 290. A source terminal of the PMOS 215 is coupled to the node 290 and a drain terminal of the PMOS 215 is coupled to the node 410. A source terminal of the PMOS 220 is coupled to the ground voltage potential 285 and a drain terminal of the PMOS 220 is coupled to the node 290. The capacitor 235 is coupled between the node 410 and the ground voltage potential 285. A source terminal of the PMOS 225 is coupled to the node 294 and a drain terminal of the PMOS 225 is coupled to the node 410. A source terminal of the PMOS 230 is coupled to the ground voltage potential 285 and a drain terminal of the PMOS 230 is coupled to the node 294. The inductor 240 is coupled between the node 294 and a node 296. A source terminal of the NMOS 245 is coupled to the Vout terminal 275 and a drain terminal of the NMOS 245 is coupled to the node 296. The resistor 250 is coupled between the node 296 and the Vbat terminal 270. A source terminal of the PMOS 405 is coupled to the Vout terminal 275 and a drain terminal of the PMOS 405 is coupled to the node 410. The capacitor 255 is coupled between the Vout terminal 275 and the ground voltage potential 285. In at least some examples, the battery 280 is coupled between the Vbat terminal 270 and the ground voltage potential 285. Further, the charger controller 260 is coupled to gate terminals of each of the PMOS 215, PMOS 220, PMOS 230, NMOS 245, and PMOS 405.

In an example of operation of the circuit 400, the charger controller 260 controls the PMOS 215, PMOS 220, PMOS 230, NMOS 245, and/or PMOS 405 to operate the circuit 400 in one of a plurality of operation modes. For example, during a charging operation mode, the charger controller 260 controls the PMOS 215, PMOS 220, PMOS 230, NMOS 245, and/or PMOS 405 to provide energy from the Vin terminal 265 to both the Vout terminal 275 (e.g., to power devices (not shown) coupled to the Vout terminal 275) and the Vbat terminal 270 (e.g., to charge the battery 280). The charger controller 260 controls the PMOS 215, PMOS 220, PMOS 230, NMOS 245, and/or PMOS 405, in some examples, at least partially based on Ctrl (not shown). Ctrl indicates, in some examples, a value of Vin with respect to a value of Vbat. For examples, Ctrl indicates whether Vin is greater than or less than Vbat. Ctrl is received by the charger controller 260, in some examples, from a device or component outside of, but coupled to, the circuit 400. In other examples, Ctrl is received by the charger controller 260 from a component (not shown) within the circuit 400. In yet other examples, Ctrl is determined by the charger controller 260 based on couplings (not shown) between the charger controller 260 and each of the Vin terminal 265 and the Vbat terminal 270. In some examples, the charger controller 260 further controls the PMOS 215, PMOS 220, PMOS 230, NMOS 245, and/or PMOS 405 based on an additional received or generated signal (not shown) specifying an operation mode (e.g., such as one of the operation modes discussed below) for the circuit 400.

During the charging operation mode when Ctrl indicates to the charger controller 260 that Vin is less than Vbat, the charger controller 260 controls the PMOS 215, PMOS 220, NMOS 245, and PMOS 405 to conduct (or not conduct) energy between their respective source and drain terminals. During the charging operation mode when Vin is less than Vbat, two current paths are formed in the circuit 400. The first current path passes through the resistor 212, inductor 205, PMOS 215, and PMOS 405 and provides power from the Vin terminal 265 to the Vout terminal 275. The second current path alternatingly passes through the resistor 212, inductor 205, PMOS 215, PMOS 405, NMOS 245, and resistor 250 and provides power from the Vin terminal 265 to the Vbat terminal 270 or from the Vin terminal 265 through the resistor 212, inductor 205, and PMOS 220 to the ground voltage potential 285.

In at least some examples, the charger controller 260 controls the PMOS 215 and the PMOS 220 to selectively activate and deactivate (e.g., conduct energy between their respective source and drain terminals and not conduct energy between their respective source and drain terminals) at a duty cycle selected such that the inductor 205, PMOS 215, PMOS 220, capacitor 235, and capacitor 255 (when the PMOS 405 remains active) form a boost converter. For example, when the PMOS 215 is inactive and not conducting energy between its source and drain terminals and the PMOS 220 is active and conducting energy between its source and drain terminals, the inductor 205 is charging (e.g., storing energy) and energy previously stored in the capacitor 235 and the capacitor 255 is discharged to the Vbat terminal 270 and the Vout terminal 275. When the PMOS 215 is active and the PMOS 220 is inactive, the inductor 205 discharges to the Vbat terminal 270 and the Vout terminal 275, also at least partially recharging the capacitor 235 and the capacitor 255. Based on the duty cycle selected for control of the PMOS 215 and the PMOS 220 by the charger controller 260, as well as an inductance value of the inductor 205, a value of Vin is increased (e.g., boosted) prior to being provided to the Vbat terminal 270 and the Vout terminal 275.

During the charging operation mode when Ctrl indicates to the charger controller 260 that Vin is greater than Vbat, the charger controller 260 controls the PMOS 215, PMOS 225, PMOS 230, and PMOS 405 to conduct (or not conduct) energy between their respective source and drain terminals. During the charging operation mode when Vin is greater than Vbat, two current paths are formed in the circuit 400. The first current path passes through the resistor 212, inductor 205, PMOS 215, and PMOS 405 and provides power from the Vin terminal 265 to the Vout terminal 275. The second current path alternatingly passes through the resistor 212, inductor 205, PMOS 215, PMOS 225, inductor 240, and resistor 250 and provides power from the Vin terminal 265 to the Vbat terminal 270 or through the PMOS 230, inductor 240, and resistor 250 to the Vbat terminal 270.

In at least some examples, the charger controller 260 controls the PMOS 225 and the PMOS 230 to selectively activate and deactivate (e.g., conduct energy between its source and drain terminals and not conduct energy between its source and drain terminals) at a duty cycle selected such that the inductor 240, PMOS 225, and PMOS 230 form a buck converter. For example, when the PMOS 225 is active and the PMOS 230 is inactive, the inductor 240 is charging and power is not provided to the Vbat terminal 270. When the PMOS 225 is inactive and the PMOS 230 is active, the inductor 205 discharges to the Vbat terminal 270. Based on the duty cycle selected for control of the PMOS 225 and the PMOS 230 by the charger controller 260, as well as an inductance value of the inductor 240, a value of Vin is reduced (e.g., bucked) prior to being provided to the Vbat terminal 270.

During a discharge operation mode (e.g., when Vin is not received by the circuit 400 at the Vin terminal 265), the charger controller 260 controls the NMOS 245 to conduct energy between its source and drain terminals. During the discharge operation mode one current path is formed in the circuit 400. The current path passes from the Vbat terminal 270 through the resistor 250 and NMOS 245 to the Vout terminal 275.

During an OTG operation mode when Ctrl indicates to the charger controller 260 that Vin is less than Vbat, the charger controller 260 controls the PMOS 215, PMOS 220, NMOS 245, and PMOS 405 to conduct (or not conduct) energy between their respective source and drain terminals. During the OTG operation mode when Vin is less than Vbat, a current path is formed from the Vbat terminal 270 to the Vin terminal 265. The current path alternatingly passes from the Vbat terminal 270 through the resistor 250, NMOS 245, PMOS 405, PMOS 215, inductor 205, and resistor 212 or through the PMOS 220, inductor 205, and resistor 212 to the Vin terminal 265.

In at least some examples, the charger controller 260 controls the PMOS 215 and the PMOS 220 to selectively activate and deactivate at a duty cycle selected such that the inductor 205, PMOS 215, PMOS 220 form a buck converter. For example, when the PMOS 215 is active and conducting energy between its source and drain terminals, the inductor 205 is charging. When the PMOS 215 is active and the PMOS 220 is inactive, the inductor 205 is charging and power is not provided to the Vin terminal 265 from the Vbat terminal 270. When the PMOS 215 is inactive and the PMOS 220 is active, the inductor 205 discharges to the Vin terminal 265. Based on the duty cycle selected for control of the PMOS 215 and the PMOS 220 by the charger controller 260, as well as an inductance value of the inductor 205, a value of Vbat is reduced prior to being provided to the Vin terminal 265.

During the OTG operation mode when Ctrl indicates to the charger controller 260 that Vin is greater than Vbat, the charger controller 260 controls the PMOS 215, PMOS 220, and PMOS 225 to conduct (or not conduct) energy between their respective source and drain terminals. During the OTG operation mode when Vin is greater than Vbat, a current path is formed from the Vbat terminal 270 to the Vin terminal 265. The current path passes from the Vbat terminal 270 through the resistor 250, inductor 240, PMOS 225, PMOS 215, inductor 205, and resistor 212 to the Vin terminal 265.

In at least some examples, the charger controller 260 controls the PMOS 215 and the PMOS 220 to selectively activate and deactivate at a duty cycle selected such that the inductor 205, PMOS 215, PMOS 220, and capacitor 210 form a boost converter. For example, when the PMOS 215 is active and the PMOS 220 is inactive, the inductor 205 is charging and energy previously stored in the capacitor 210 is discharged to the Vin terminal 265. When the PMOS 215 is inactive and the PMOS 220 is active, the inductor 205 discharges to the Vin terminal 265, also at least partially recharging the capacitor 210. Based on the duty cycle selected for control of the PMOS 215 and the PMOS 220 by the charger controller 260, as well as an inductance value of the inductor 205, a value of Vbat is increased prior to being provided to the Vin terminal 265.

In a battery conservation operation mode, the charger controller 260 controls the PMOS 215, PMOS 225, PMOS 230, and PMOS 405 to conduct (or not conduct) energy between their respective source and drain terminals to establish a current path from the Vbat terminal 270 through the inductor 240 and PMOS 225 to the node 410. For example, the charger controller 260 controls the PMOS 215 and the PMOS 405 to not conduct energy between their respective source and drain terminals such that energy flowing into the node 410 charges the capacitor 235 without being passed to the Vin terminal 265 or the Vout terminal 275. Charging the capacitor 235, in some examples, enables use of the capacitor 235 to satisfy burst requirements (e.g., sudden spikes in demand from a load (not shown) coupled to the Vout terminal 275) during operation of the circuit 400. In some examples, the PMOS 215 may be activated, or deactivated, to couple the node 410 to the Vin terminal 265 based on a desired function of the circuit 400 during the battery conservation operation mode. In at least one example, operation of the circuit 400 during the battery conservation operation mode is performed substantially similar to operation of the circuit 400 during the OTG operation mode when Vin is less than Vbat.

During a turbo operation mode, a demand by a load (not shown) coupled to the Vout terminal 275 is greater than can be satisfied by Vin and the charger controller 260 controls the PMOS 215, PMOS 225, PMOS 230, and PMOS 405 to conduct (or not conduct) energy between their respective source and drain terminals. During the turbo operation mode, two current paths are formed in the circuit 400. The first current path passes from the Vin terminal 265 through, resistor 212, inductor 205, PMOS 215, and PMOS 405 to the Vout terminal 275. The second current path alternatingly passes from the Vbat terminal 270 through the resistor 250, inductor 240, and PMOS 225 to the Vout terminal 275 or from the Vbat terminal 270 through the resistor 250, inductor 240, and PMOS 230 to the ground voltage potential 285.

In at least some examples, the charger controller 260 controls the PMOS 225 and the PMOS 230 to selectively activate and deactivate at a duty cycle selected such that the inductor 240, PMOS 225, PMOS 230, capacitor 235, and capacitor 255 form a boost converter. For example, when the PMOS 225 is inactive and the PMOS 230 is active, the inductor 240 is charging and, in some examples, energy previously stored in the capacitor 235 and the capacitor 255 is discharged to the Vout terminal 275. When the PMOS 225 is active and the PMOS 230 is inactive, the inductor 240 discharges to the Vout terminal 275, in some examples also at least partially recharging the capacitor 235 and the capacitor 255. Based on the duty cycle selected for control of the PMOS 225 and the PMOS 230 by the charger controller 260, as well as an inductance value of the inductor 240, a value of Vbat is increased prior to being provided to the Vout terminal 275.

During a UPS operation mode, Vbat supplements power provided to the Vout terminal 275 by Vin, as well as provides power to the Vin terminal 265. During the UPS operation mode, when Ctrl indicates to the charger controller 260 that Vin is less than Vbat, the charger controller 260 controls the PMOS 215, PMOS 220, NMOS 245, and PMOS 405 to conduct (or not conduct) energy between their respective source and drain terminals. During the UPS operation mode when Vin is less than Vbat, two current paths are formed in the circuit 400 substantially the same as during the OTG operation mode when Vin is less than Vbat and during the discharge operation mode, the details of which are not repeated herein.

During the UPS operation mode, when Ctrl indicates to the charger controller 260 that Vin is greater than Vbat, the charger controller 260 controls the PMOS 215, PMOS 220, PMOS 225, PMOS 230, and PMOS 405 to conduct (or not conduct) energy between their respective source and drain terminals. During the UPS operation mode when Vin is greater than Vbat, two current paths are formed in the circuit 400 substantially the same as during the OTG operation mode when Vin is greater than Vbat and during the turbo operation mode when Vin is greater than Vbat, the details of which are not repeated herein.

Figure 5:
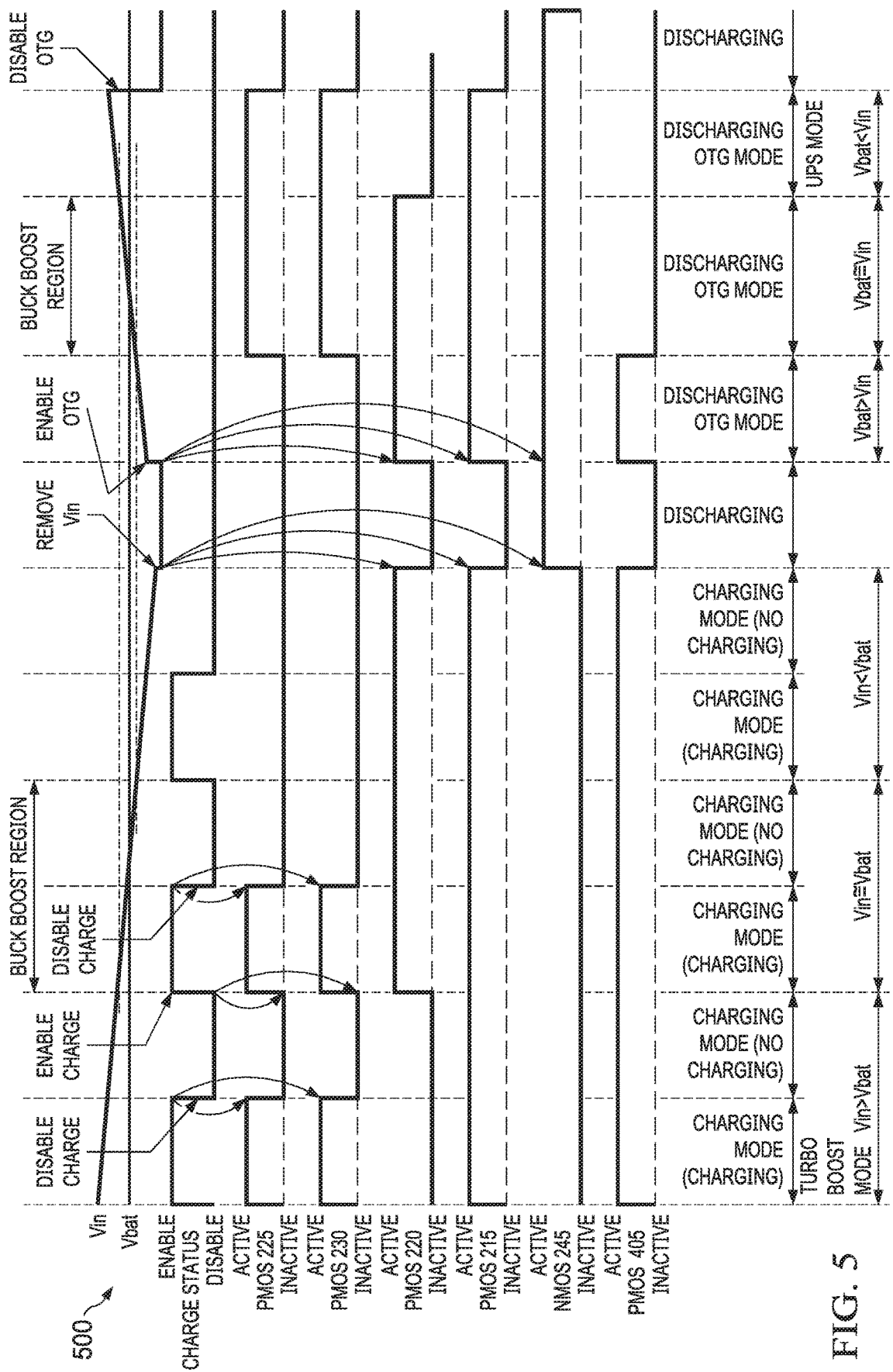
FIG. 5 shows a timing diagram of illustrative signals in accordance with various examples.

Referring now to FIG. 5, a timing diagram 500 of illustrative signals is shown. The diagram 500 is illustrative of at least one exemplary architecture and operation of the circuit 400, discussed above with reference to FIG. 4. The diagram 500 illustrates a PMOS 230 control signal, a PMOS 225 control signal, a PMOS 220 control signal, a PMOS 215 control signal, an NMOS 245 control signal, and a PMOS 405 control signal. Each of the control signals, in some examples, exists in either an active state (in which the corresponding transistor is active and conducting) or inactive (in which the corresponding transistor is inactive and not conducting). In some examples, each of the control signals is generated by the charger controller 260 and is provided to a gate terminal of the respective transistor that is under control via the control signal. The diagram 500 further illustrates Vin, Vbat, and a Charge Status signal. The Charge Status signal, in some examples, indicates whether the battery 280 of FIG. 4 is charging. The Charge Status signal, in some examples, is generated by the charger controller 260 based at least partially on a status of one or more control signals generated and output by the charger controller 260 (e.g., such as the PMOS 230 control signal, the PMOS 225 control signal, the PMOS 220 control signal, the PMOS 215 control signal, the NMOS 245 control signal, and/or the PMOS 405 control signal).

As shown along the horizontal axis of the diagram 500 as discussed above with respect to FIG. 4, each operation mode of the circuit 400 corresponds to a unique combination of states of the controls signals generated by the charger controller 260. In some examples, by omitting the PMOS 405 control signal, the diagram 500 is representative of operation of the circuit 200. Additionally, in some examples, by modifying the PMOS 405 control signal according to the descriptions of FIG. 3, the diagram 500 is representative of operation of the circuit 300 and by maintaining the PMOS 405 in a constant active state, the diagram 500 is representative of operations of the circuit 200.

Figure 6A:
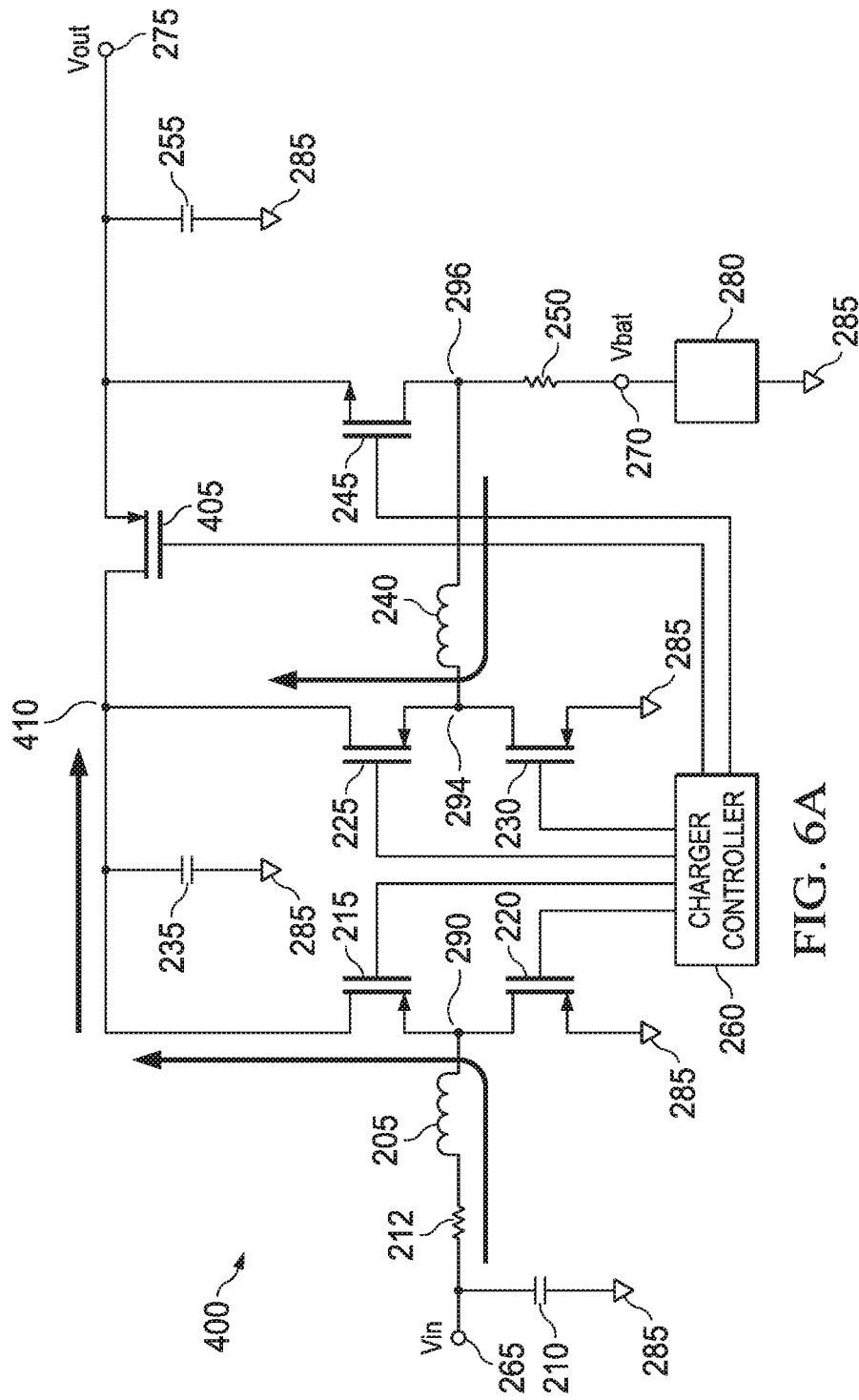
FIGS. 6A-6H show current paths through at least one circuit of the present disclosure in accordance with various examples.
Figure 6B:
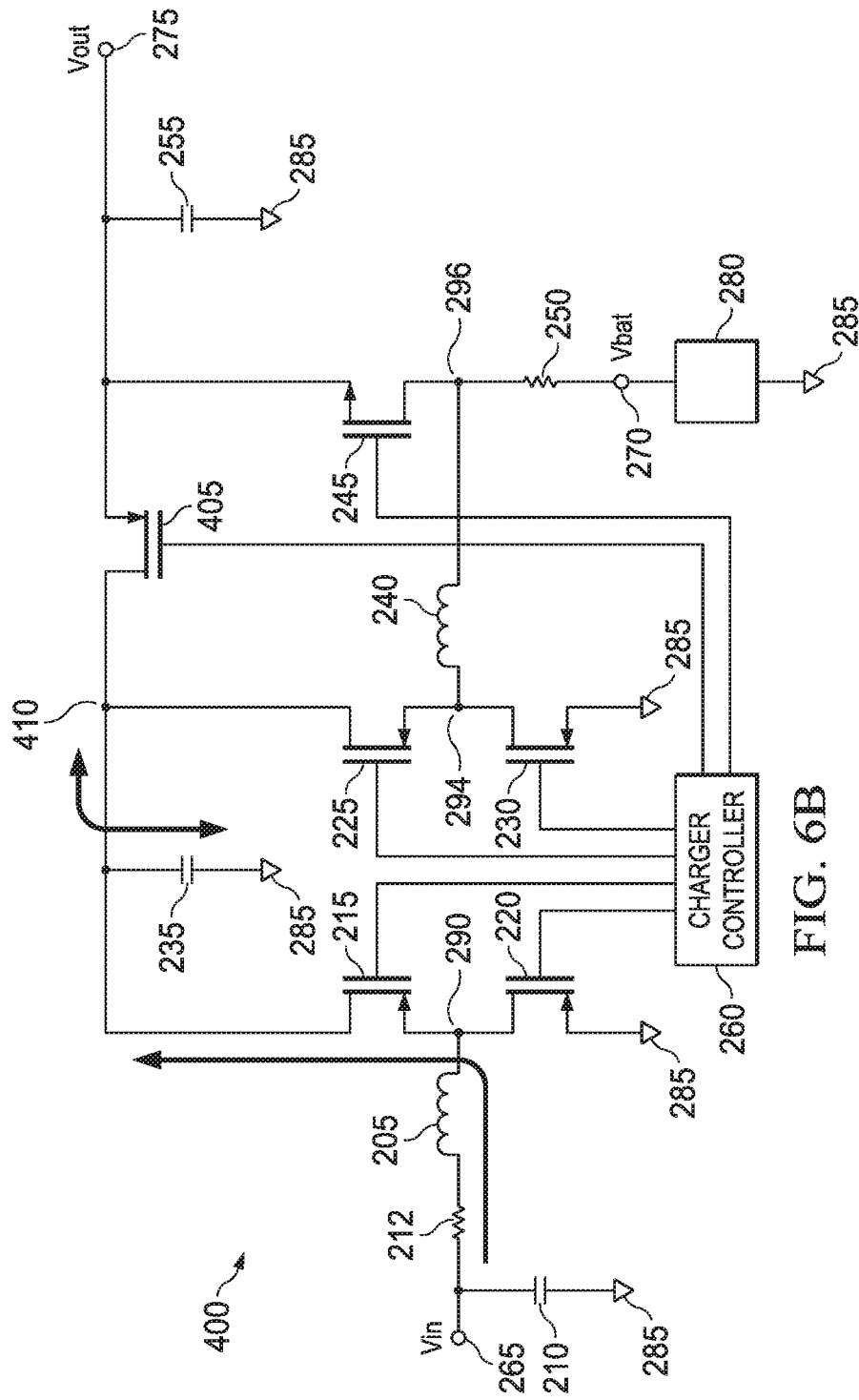
Figure 6C:
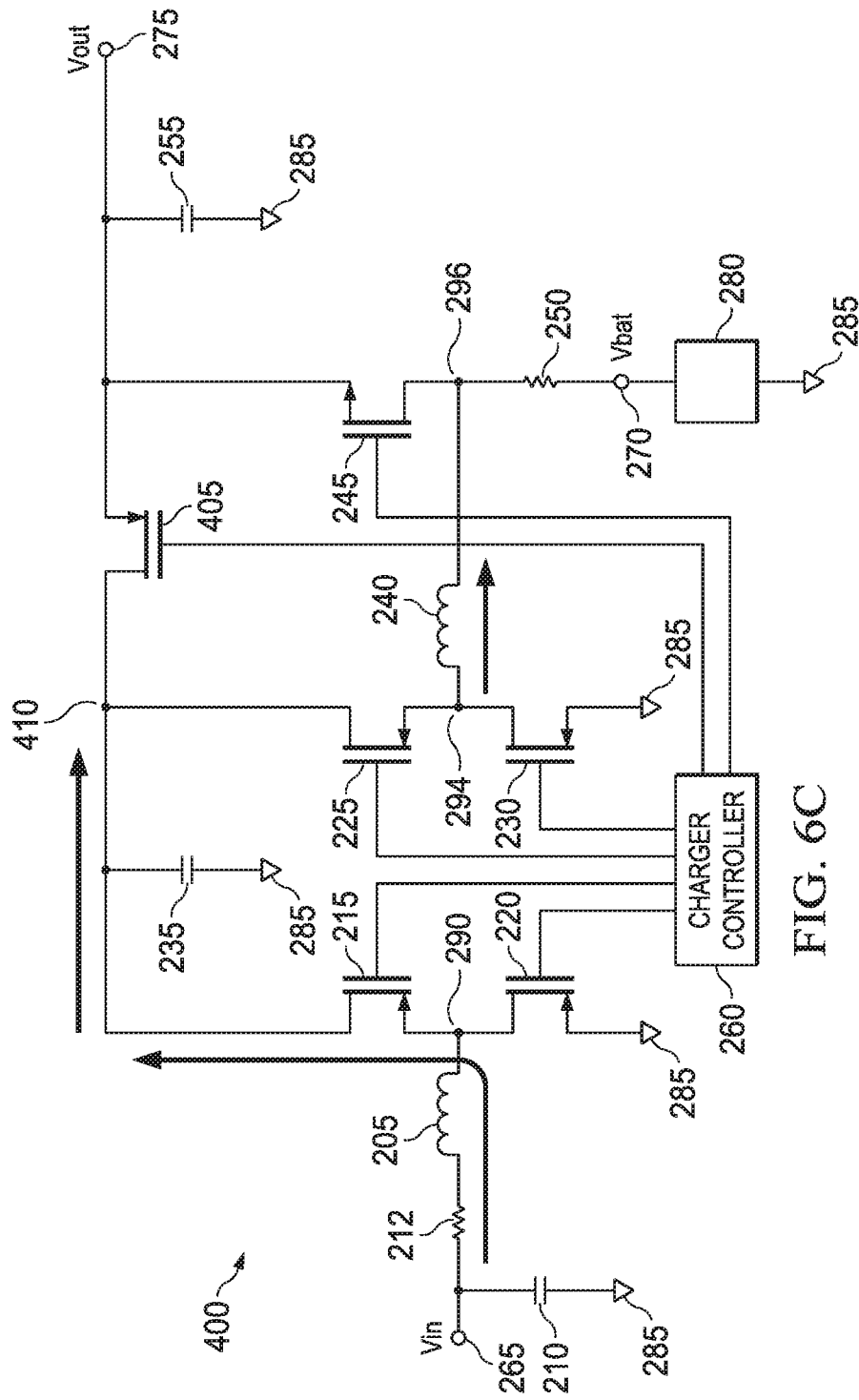
Figure 6D:
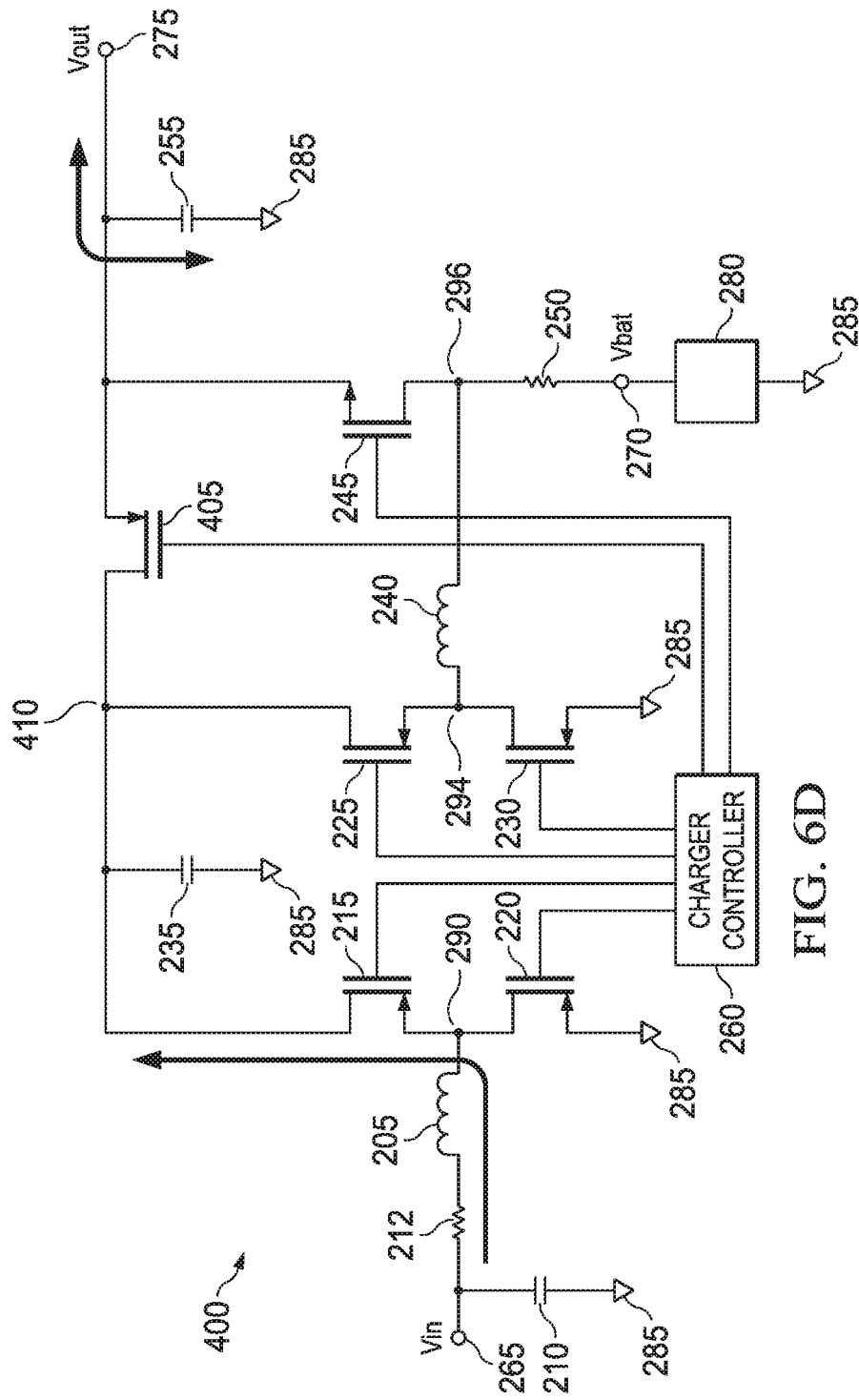
Figure 6E:
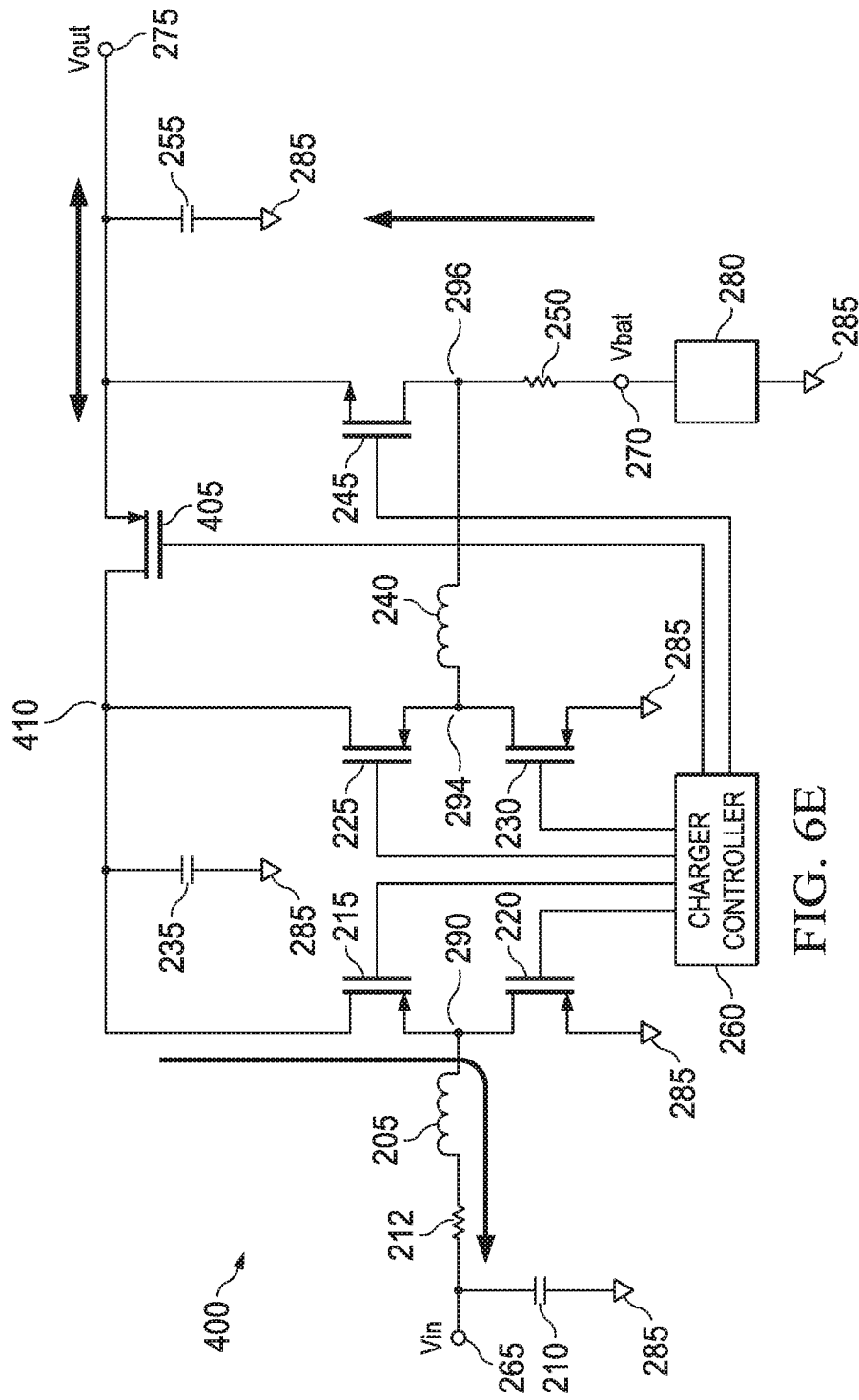
Figure 6F:
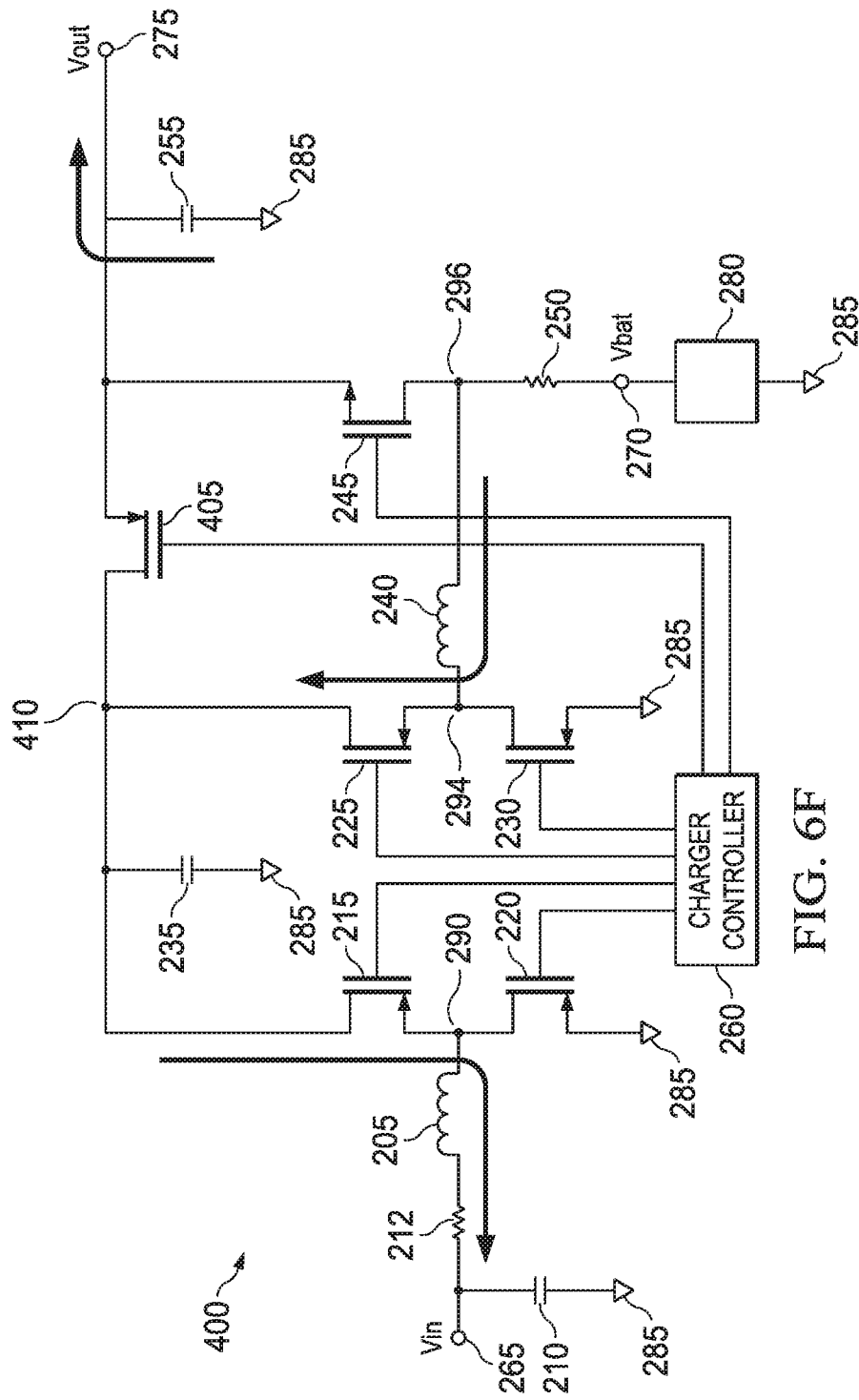
Figure 6G:
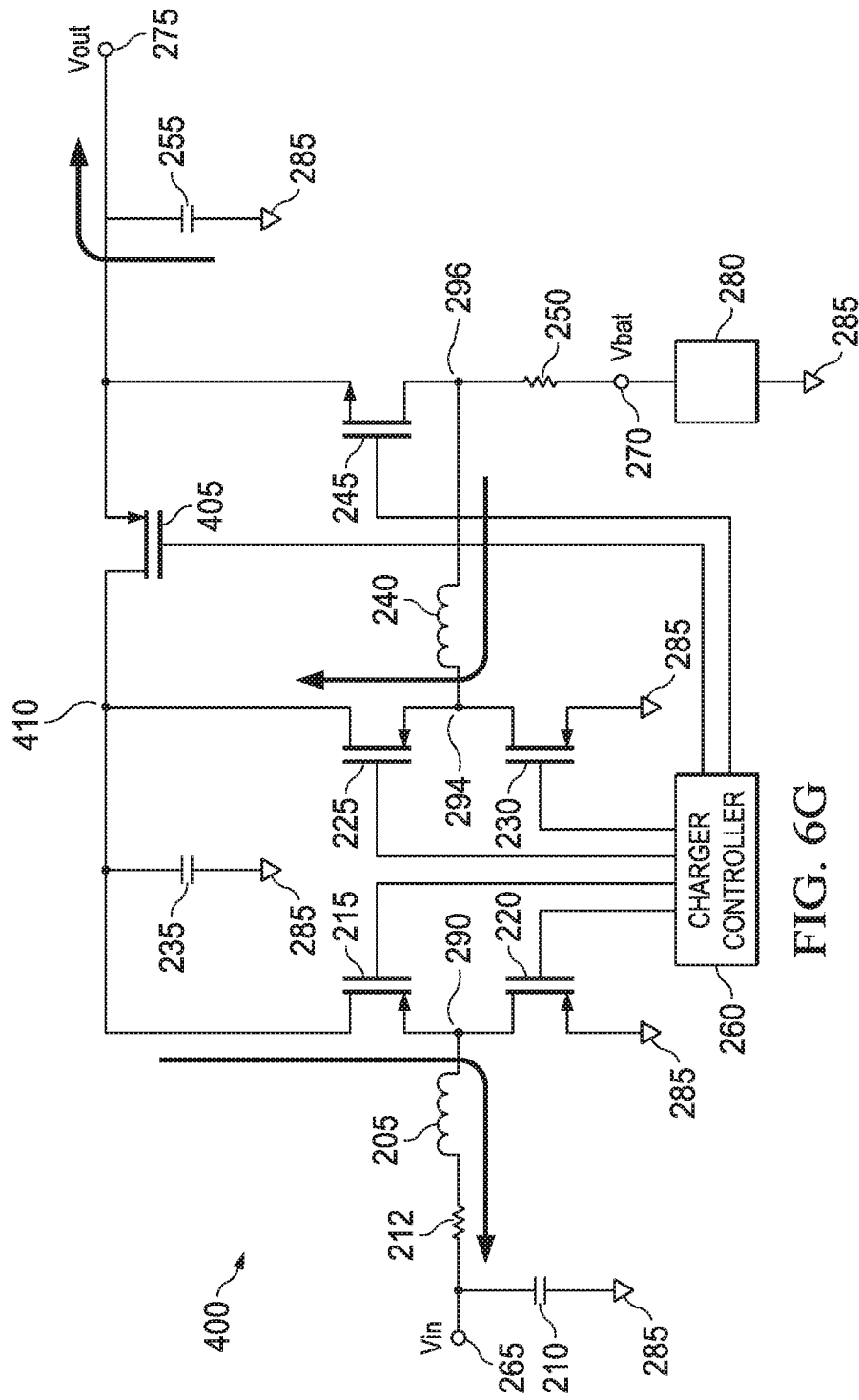
Figure 6H:
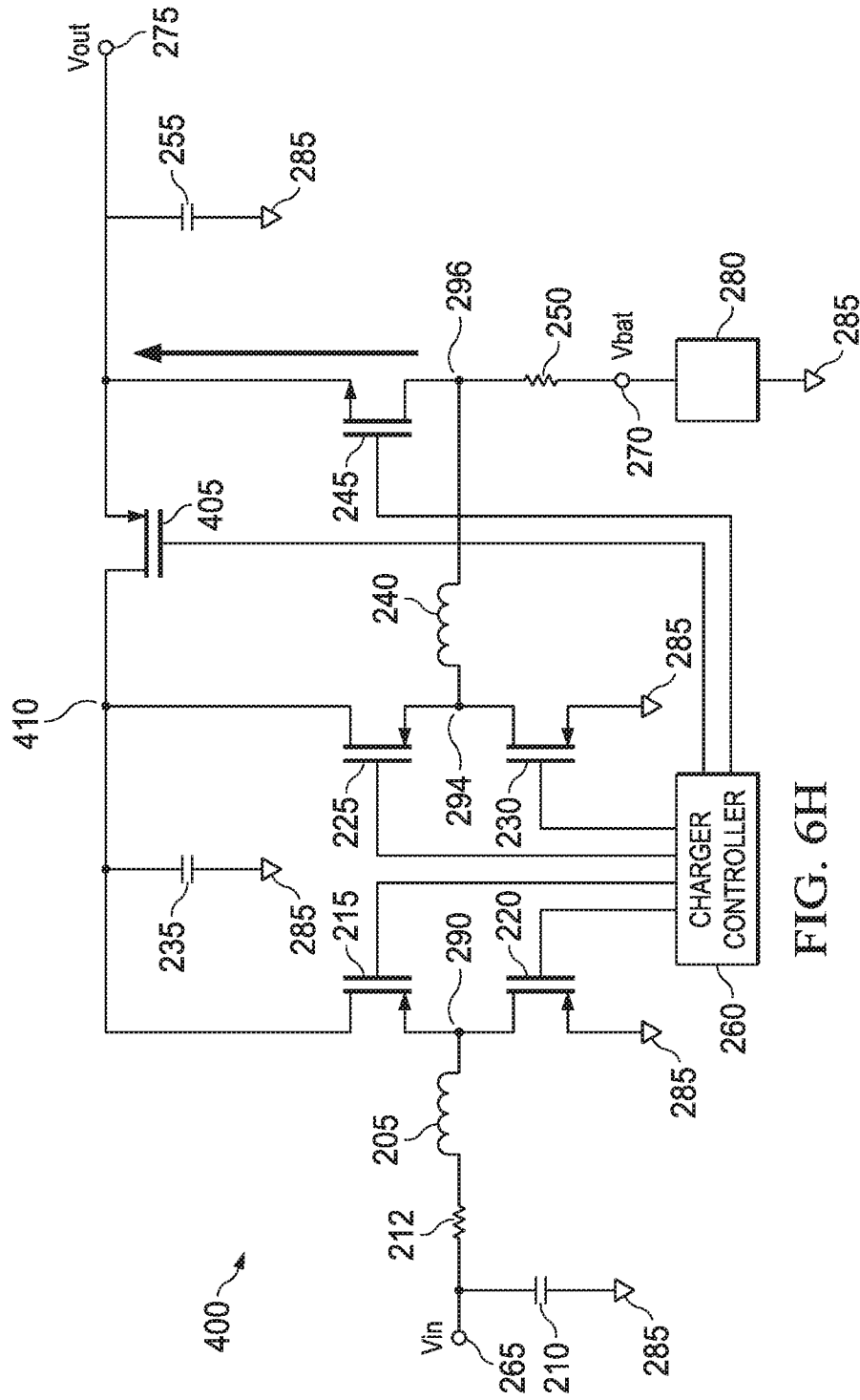

As illustrated in diagram 500, the circuit 400 is configured to operate in a plurality of operation modes based on control signals provided to the PMOS 405, PMOS 215, PMOS 220, PMOS 225, PMOS 230, and NMOS 245, as well the value of Vin with respect to the value of Vbat. For each operation mode, one or more current paths are formed in the circuit 400. For example, when Vin is greater than Vbat and the turbo boost mode is active in the circuit 400, current paths as shown in FIG. 6A are formed. When Vin is greater than Vbat and the turbo boost mode is not active in the circuit 400, in at least one example, current paths as shown in FIG. 6B are formed. Similarly, when Vin is approximately equal to Vbat (such as during operation while in a buck-boost region) and the circuit 400 is in a charging mode, in at least one example, current paths as shown in FIG. 6C are formed. When Vin is less than Vbat and the circuit 400 is in the charging mode, in at least one example, current paths as shown in FIG. 6D are formed. While during a discharging mode of the circuit 400, when Vin is greater than Vin, in at least one example, current paths as shown in FIG. 6E are formed. When Vbat is approximately equal to Vin (such as during operation while in a buck-boost region) and the circuit 400 is in the discharging mode, in at least one example, current paths as shown in FIG. 6F are formed. When Vbat is less than Vin and the circuit 400 is in the discharging mode, in at least one example, current paths as shown in FIG. 6G are formed. When the circuit 400 is discharging from Vbat terminal 270 to Vout terminal 275, in at least one example, current paths as shown in FIG. 6H are formed.

Figure 7:
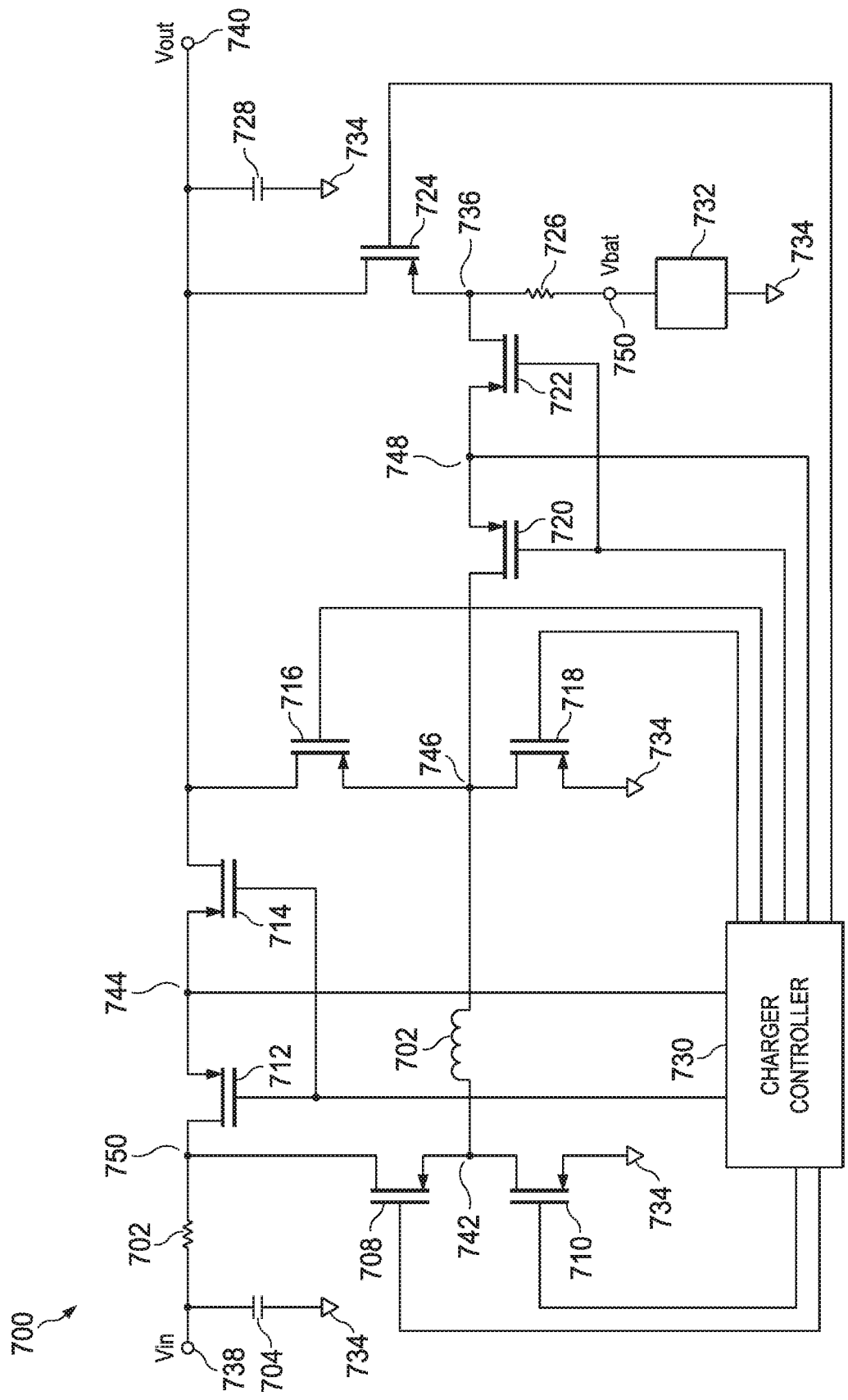
FIG. 7 shows a schematic diagram of an illustrative circuit in accordance with various examples.

Referring now to FIG. 7, a schematic diagram of an illustrative circuit 700 is shown. In some examples, the circuit 700 is a power management circuit, for example, suitable for implementation as the controller 110 of the system 100 of FIG. 1, discussed above. In some examples, the circuit 700 includes, or is configured to couple to, an inductor 704, a capacitor 706, a resistor 707, PMOS 708, PMOS 710, PMOS 712, PMOS 714, PMOS 716, PMOS 718, PMOS 720, PMOS 722, PMOS 724 a capacitor 728, a resistor 726, and/or a charger controller 730, along with a Vin terminal 738 at which a signal Vin is present, Node 736 at which a signal Vbat is present, and Vout terminal 740 at which a signal Vout is present. In some examples, the circuit 200 further includes, or is configured to couple to, a battery 732. In at least one example, the charger controller 730 is a processor or microprocessor suitable for monitoring one or more input signals and generating one or more output signals based on determinations made according to values of at least some of the one or more input signals. In other examples, the charger controller 730 is any analog, digital or mixed-signal circuit suitable for performing the signal monitoring and generation as discussed above. Additionally, while certain devices are described herein as PMOS, in some examples the devices are replaced by another device of substantially similar functionality (e.g., replacing PMOS with NMOS, either PMOS or NMOS with bi-polar junction transistor (BJT), etc.), the scope of which is not limited herein. For example, in certain high-power applications, such as high-power switching converters, it may be desirable to replace PMOS devices with NMOS devices.

In an example architecture of the circuit 700, the capacitor 706 is coupled between the Vin terminal 738 and a ground voltage potential 734. The resistor 707 is coupled between the Vin terminal 265 and a Vbat terminal 750. A drain terminal of the PMOS 708 is coupled to the Vbat terminal 750 and a source terminal of the PMOS 708 is coupled to a node 742. A drain terminal of the PMOS 710 is coupled to the node 742 and a source terminal of the PMOS 710 is coupled to the ground voltage potential 734. A drain terminal of the PMOS 712 is coupled to the Vbat terminal 750 and a source terminal of the PMOS 712 is coupled to a node 744. A source terminal of the PMOS 714 is coupled to the node 744 and a drain terminal of the PMOS 714 is coupled to the Vout terminal 740. A drain terminal of the PMOS 716 is coupled to the Vout terminal 740 and a source terminal of the PMOS 716 is coupled to a node 746. A drain terminal of the PMOS 718 is coupled to the node 746 and a source terminal of the PMOS 718 is coupled to the ground voltage potential 734. The inductor 702 is coupled between the node 742 and the node 746. A drain terminal of the PMOS 720 is coupled to the node 746 and a source terminal of the PMOS 720 is coupled to a node 748. A source terminal of the PMOS 722 is coupled to the node 748 and a drain terminal of the PMOS 722 is coupled to the Node 736. A drain terminal of the PMOS 724 is coupled to the Vout terminal 740 and a source terminal of the PMOS 724 is coupled to the Node 736. The capacitor 728 is coupled between the Vout terminal 740 and the ground voltage potential 734. The resistor 726 is coupled between the node 736 and the Vbat terminal 750. In at least some examples, the battery 732 is coupled between the Vbat terminal 750 and the ground voltage potential 734. Further, the charger controller 730 is coupled to gate terminals of each of the PMOS 708, PMOS 710, PMOS 712, PMOS 714, PMOS 716, PMOS 718, PMOS 720, PMOS 722, and PMOS 724, to the node 744, and to the node 748.

In an example of operation of the circuit 700, the charger controller 730 controls the PMOS 708, PMOS 710, PMOS 712, PMOS 714, PMOS 716, PMOS 718, PMOS 720, PMOS 722, and/or PMOS 724 to operate the circuit 700 in one of a plurality of operation modes. For example, during a charging operation mode, the charger controller 730 controls the PMOS 708, PMOS 710, PMOS 712, PMOS 714, PMOS 716, PMOS 718, PMOS 720, PMOS 722, and/or PMOS 724 to provide energy from the Vin terminal 738 to both the Vout terminal 740 (e.g., to power devices (not shown) coupled to the Vout terminal 740) and to the Vbat terminal 750 (e.g., to charge the battery 732). The charger controller 730 controls the PMOS 708, PMOS 710, PMOS 712, PMOS 714, PMOS 716, PMOS 718, PMOS 720, PMOS 722, and/or PMOS 724, in some examples, at least partially based on Ctrl (not shown). Ctrl indicates, in some examples, a value of Vin with respect to a value of Vbat. For examples, Ctrl indicates whether Vin is greater than or less than Vbat. Ctrl is received by the charger controller 730, in some examples, from a device or component outside of, but coupled to, the circuit 700. In other examples, Ctrl is received by the charger controller 730 from a component (not shown) within the circuit 700. In yet other examples, Ctrl is determined by the charger controller 730 based on couplings (not shown) between the charger controller 730 and each of the Vin terminal 738 and the Vbat terminal 750. In some examples, the charger controller 730 further controls the PMOS 708, PMOS 710, PMOS 712, PMOS 714, PMOS 716, PMOS 718, PMOS 720, PMOS 722, and/or PMOS 724 based on an additional received or generated signal (not shown) specifying an operation mode (e.g., such as one of the operation modes discussed below) for the circuit 700.

During the charging operation mode when Ctrl indicates to the charger controller 730 that Vin is less than Vbat, in one example, the charger controller 730 controls the PMOS 708, PMOS 716, and PMOS 718 (e.g., based at least partially on a value of a signal provided to their respective gate terminals) to conduct (or not conduct) energy between their respective source and drain terminals to form a path between the Vin terminal 738 and the Vout terminal 740. In another example when Vin is less than Vbat, the charger controller 730 controls the PMOS 708, PMOS 716, PMOS 718, PMOS 720, and PMOS 722 (e.g., based at least partially on a value of a signal provided to their respective gate terminals) to conduct (or not conduct) energy between their respective source and drain terminals to form a path between the Vin terminal 738 and the Vbat terminal 750.

During the charging operation mode when Ctrl indicates to the charger controller 730 that Vin is greater than Vbat, in one example, the charger controller 730 controls the PMOS 708, PMOS 716, and PMOS 718 to conduct (or not conduct) energy between their respective source and drain terminals to form a path between the Vin terminal 738 and the Vout terminal 740. In another example, when Vin is greater than Vbat, the charger controller 730 controls the PMOS 708, PMOS 710, PMOS 716, PMOS 720, and PMOS 722 (e.g., based at least partially on a value of a signal provided to their respective gate terminals) to conduct (or not conduct) energy between their respective source and drain terminals to form a path between the Vin terminal 738 and the Vbat terminal 750.

During a discharge operation mode (e.g., when Vin is not received by the circuit 700 at the Vin terminal 738), the charger controller 730 controls the PMOS 724 to conduct energy between its source and drain terminals. During the discharge operation mode a current path is formed passes from the Vbat terminal 750 through the resistor 726 and PMOS 724 to the Vout terminal 740.

During an OTG operation mode when Ctrl indicates to the charger controller 730 that Vin is greater than Vbat, or when in a battery reserve operation mode, in one example, the charger controller 730 controls the PMOS 708, PMOS 710, PMOS 716, PMOS 720, PMOS 722, and PMOS 724 to conduct (or not conduct) energy between their respective source and drain terminals to form a path from the Vbat terminal 750 to the Vin terminal 738. In another example, when Vin is less than Vbat, the charger controller 730 controls the PMOS 708, PMOS 716, PMOS 718, PMOS 720, PMOS 722, and PMOS 724 to conduct (or not conduct) energy between their respective source and drain terminals to form a path from the Vbat terminal 750 to the Vin terminal 738.

During a turbo operation mode (sometimes referred to as a hybrid operation mode or a turbo boost mode), a demand by a load (not shown) coupled to the Vout terminal 740 is greater than can be satisfied by Vin and the charger controller 730 controls the PMOS 708, PMOS 710, PMOS 712, PMOS 714, PMOS 716, PMOS 720, PMOS 722, and PMOS 724, to conduct (or not conduct) energy between their respective source and drain terminals to form two current paths in the circuit 700. The first current path passes from the Vin terminal 738 to the Vout terminal 740 and the second current path passes from the Vbat terminal 750 to the Vout terminal 740.

During a UPS operation mode, Vbat supplements power provided to the Vout terminal 740 by Vin, as well as provides power to the Vin terminal 738. During the UPS operation mode and when Ctrl indicates to the charger controller 730 that Vin is less than Vbat, the charger controller 730 controls the PMOS 708, PMOS 716, PMOS 718, PMOS 720, and PMOS 722 to conduct (or not conduct) energy between their respective source and drain terminals to form a current path between the Vbat terminal 750 and the Vin terminal 738. During the UPS operation mode and when Ctrl indicates to the charger controller 730 that Vin is less than Vbat, the charger controller 730 also controls the PMOS 724 to conduct (or not conduct) energy between its source and drain terminals to form a current path between the Vbat terminal 750 and the Vout terminal 740. During the UPS operation mode and when Ctrl indicates to the charger controller 730 that Vin is greater than Vbat, the charger controller 730 controls the PMOS 708, PMOS 710, PMOS 716, PMOS 720, and PMOS 722 to conduct (or not conduct) energy between their respective source and drain terminals to form a current path between the Vbat terminal 750 and the Vin terminal 738. During the UPS operation mode and when Ctrl indicates to the charger controller 730 that Vin is greater than Vbat, the charger controller 730 also controls the PMOS 708, PMOS 710, PMOS 712, PMOS 714, PMOS 716, PMOS 720, and PMOS 722 to conduct (or not conduct) energy between their respective source and drain terminals to form a current path between the Vbat terminal 750 and the Vout terminal 740.

Referring now to FIG. 8, a table 800 of illustrative circuit characteristics is shown. In at least some examples, the table 800 compares characteristics of a typical circuit implementation (not shown herein) with the circuit 200, circuit 300, circuit 400, and circuit 700 disclosed herein. For example, the table 800 compares a number of power components (e.g., such as switches and/or inductors) in a current path of the respective circuit 200, circuit 300, circuit 400, and circuit 700 for a given mode of operation. As shown in FIG. 8, the circuit 200, circuit 300, and circuit 400 each provide for a reduced number of transistors in at least some current paths for at least some modes of operation, thereby improving operational efficiency of the respective circuit 200, circuit 300, and/or circuit 400.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., field effect transistor (FET), MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
   a first inductor having a first terminal configured to couple to a first node and a second terminal configured to couple to a second node;
   a first p-type metal oxide semiconductor field effect transistor (MOSFET) (PMOS) having a source terminal coupled to the second node and a drain terminal coupled to a third node;
   a second PMOS having a source terminal coupled to a ground voltage potential and a drain terminal coupled to the second node;
   a third PMOS having a source terminal coupled to a fourth node and a drain terminal coupled to the third node;
   a fourth PMOS having a source terminal coupled to the ground voltage potential and a drain terminal coupled to the fourth node;
   a n-type MOSFET (NMOS) having a source terminal coupled to the third node and a drain terminal coupled to a fifth node;
   a second inductor having a first terminal configured to couple to the fourth node and a second terminal configured to couple to the fifth node; and
   a controller coupled to a gate terminal of the first PMOS, a gate terminal of the second PMOS, a gate terminal of the third PMOS, a gate terminal of the fourth PMOS, and a gate terminal of the NMOS.

2. The circuit of claim 1, further comprising:
   a first resistor configured to couple between the first node and a sixth node;
   a first capacitor configured to couple between the sixth node and the ground voltage potential;
   a second capacitor configured to couple between the third node and the ground voltage potential;
   a third capacitor configured to couple between the third node and the ground voltage potential; and
   a second resistor configured to couple between the fifth node and a seventh node.

3. The circuit of claim 2, further comprising a fifth PMOS having a source terminal coupled to the sixth node, a drain terminal coupled to an eighth node, and a gate terminal coupled to the controller.

4. The circuit of claim 2, further comprising a fifth PMOS configured to couple between the second capacitor and the third capacitor and having a gate terminal coupled to the controller.

5. The circuit of claim 2, further comprising a battery configured to couple between the seventh node and the ground voltage potential.

6. The circuit of claim 1, wherein the controller is configured to control the first PMOS, the second PMOS, the third PMOS, the fourth PMOS, and the NMOS to:
   couple the first node to the fourth node and the fifth node during a charging operation mode; and
   couple the fifth node to the fourth node during a discharge operation mode.

7. The circuit of claim 1, wherein the controller is configured to control the first PMOS, the second PMOS, the third PMOS, the fourth PMOS, and the NMOS to:
 couple the fifth node to the first node during an on-the-go operation mode; and
 couple the first node and the fifth node to the fourth node during a turbo operation mode.

8. The circuit of claim 1, wherein the controller is configured to control the first PMOS, the second PMOS, the third PMOS, the fourth PMOS, and the NMOS to operate as an uninterrupted power supply supplying power to the third node.

9. A system, comprising:
 a circuit, comprising:
  a first resistor configured to couple between a first node and a second node;
  a first inductor coupled between the second node and the third node;
  a first p-type metal oxide semiconductor field effect transistor (MOSFET) (PMOS) having a source terminal coupled to the third node and a drain terminal coupled to a fourth node;
  a second PMOS having a source terminal coupled to a ground voltage potential and a drain terminal coupled to the third node;
  a third PMOS having a source terminal coupled to a fifth node and a drain terminal coupled to the fourth node;
  a fourth PMOS having a source terminal coupled to the ground voltage potential and a drain terminal coupled to the fifth node;
  a n-type MOSFET (NMOS) having a source terminal coupled to the fourth node and a drain terminal coupled to a sixth node;
  a second inductor having a first terminal configured to couple to the fifth node and a second terminal configured to couple to the sixth node; and
  a controller coupled to a gate terminal of the first PMOS, a gate terminal of the second PMOS, a gate terminal of the third PMOS, a gate terminal of the fourth PMOS, and a gate terminal of the NMOS;
 a load configured to couple to the fourth node; and
 a battery configured to couple between the sixth node and the ground voltage potential.

10. The system of claim 9, further comprising:
 a first capacitor configured to couple between the first node and the ground voltage potential;
 a second capacitor configured to couple between the fourth node and the ground voltage potential;
 a third capacitor configured to couple between the fourth node and the ground voltage potential; and
 a second resistor configured to couple between the sixth node and the battery.

11. The system of claim 9, further comprising a fifth PMOS having a source terminal coupled to the load, a drain terminal coupled to the fourth node, and a gate terminal coupled to the controller.

12. The system of claim 11, further comprising a sixth PMOS having a source terminal coupled to the first node, a drain terminal coupled to a seventh node, and a gate terminal coupled to the controller.

13. The system of claim 9, further comprising a sixth PMOS having a source terminal coupled to the first node, a drain terminal coupled to a seventh node, and a gate terminal coupled to the controller.

14. The system of claim 9, wherein the controller is configured to control a plurality of the first PMOS, the second PMOS, the third PMOS, the fourth PMOS, and the NMOS to operate the controller in one of a plurality of operation modes, the plurality of operations modes comprising a charging operation mode, a discharge operation mode, an on-the-go operation mode, a turbo operation mode, and an uninterrupted power supply operation mode.

15. The system of claim 9, wherein the controller is configured to control a plurality of the first PMOS, the second PMOS, the third PMOS, the fourth PMOS, and the NMOS according to a relationship between an input voltage received at the first node and a voltage of the battery.

16. A circuit, comprising:
 a first inductor having a first terminal configured to couple to a first node and a second terminal configured to couple to a second node;
 a first p-type metal oxide semiconductor field effect transistor (MOSFET) (PMOS) having a source terminal coupled to the second node and a drain terminal coupled to a third node;
 a second PMOS having a source terminal coupled to a ground voltage potential and a drain terminal coupled to the second node;
 a third PMOS having a source terminal coupled to a fourth node and a drain terminal coupled to the third node;
 a fourth PMOS having a source terminal coupled to the ground voltage potential and a drain terminal coupled to the fourth node;
 a fifth PMOS having a source terminal coupled to a fifth node and a drain terminal coupled to the third node;
 a n-type MOSFET (NMOS) having a source terminal coupled to the fourth node and a drain terminal coupled to a sixth node;
 a second inductor having a first terminal configured to couple to the fourth node and a second terminal configured to couple to the sixth node; and
 a controller coupled to a gate terminal of the first PMOS, a gate terminal of the second PMOS, a gate terminal of the third PMOS, a gate terminal of the fourth PMOS, a gate terminal of the fifth PMOS, and a gate terminal of the NMOS.

17. The circuit of claim 16, further comprising:
 a first resistor configured to couple between the first node and a seventh node;
 a first capacitor configured to couple between the seventh node and the ground voltage potential;
 a second capacitor configured to couple between the third node and the ground voltage potential;
 a third capacitor configured to couple between the fifth node and the ground voltage potential; and
 a second resistor configured to couple between the sixth node and an eighth node.

18. The circuit of claim 17, further comprising a battery configured to couple between the eighth node and the ground voltage potential.

19. The circuit of claim 18, wherein the controller is configured to control a plurality of the first PMOS, the second PMOS, the third PMOS, the fourth PMOS, the fifth PMOS, and the NMOS according to a relationship between an input voltage received at the first node and a voltage of a battery.

20. The circuit of claim 16, wherein the controller is configured to control a plurality of the first PMOS, the second PMOS, the third PMOS, the fourth PMOS, the fifth PMOS, and the NMOS to operate the controller in one of a plurality of operation modes, the plurality of operations modes comprising a charging operation mode, a discharge operation mode, an on-the-go operation mode, a turbo operation mode, and an uninterrupted power supply operation mode.

* * * * *